United States Patent
Zhou et al.

(10) Patent No.: US 11,569,806 B2
(45) Date of Patent: Jan. 31, 2023

(54) DUTY CYCLE ADJUSTMENT CIRCUIT WITH INDEPENDENT RANGE AND STEP SIZE CONTROL

(71) Applicant: Synopsys, Inc., Mountain View, CA (US)

(72) Inventors: Kuan Zhou, Newton, MA (US); David Da-Wei Lin, Westborough, MA (US); Vladimir Zlatkovic, Belmont, MA (US); Shefali Walia, Boxborough, MA (US); Youssef Mamdouh El-Toukhy, Cairo (EG); Abdelrahman Alaa Gouda, Cairo (EG); Alexander A. Alexeyev, Beverly, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/591,520

(22) Filed: Feb. 2, 2022

(65) Prior Publication Data
US 2022/0247398 A1    Aug. 4, 2022

Related U.S. Application Data

(60) Provisional application No. 63/145,157, filed on Feb. 3, 2021.

(51) Int. Cl.
*H03K 5/156*    (2006.01)
*G06F 1/04*    (2006.01)

(52) U.S. Cl.
CPC ............. *H03K 5/1565* (2013.01); *G06F 1/04* (2013.01)

(58) Field of Classification Search
None
See application file for complete search history.

(56) References Cited

U.S. PATENT DOCUMENTS

2013/0207701 A1\*    8/2013    Kitagawa ............. H03K 5/1506
                                                              327/158

\* cited by examiner

*Primary Examiner* — Cassandra F Cox
(74) *Attorney, Agent, or Firm* — Patterson + Sheridan, LLP

(57) ABSTRACT

Duty cycle adjustment circuitry includes a first stage, a second stage, and decoder circuitry. The first stage includes a first strength tuning circuit having first inverter branches, and a first fine tuning circuit having second inverter branches. The first strength tuning circuit and the first fine tuning circuit are coupled in parallel. The second stage includes a second strength tuning circuit having third inverter branches, and a second fine tuning circuit having fourth inverter branches. The second strength tuning circuit and the second fine tuning circuit are coupled in parallel. Further, the second stage is electrically coupled to the first stage. The decoder circuitry is electrically coupled to the first stage and the second stage. The decoder circuitry controls the first strength tuning circuit independently from the first fine tuning circuit to adjust the duty cycle of an input signal received by the duty cycle adjustment circuitry.

20 Claims, 14 Drawing Sheets

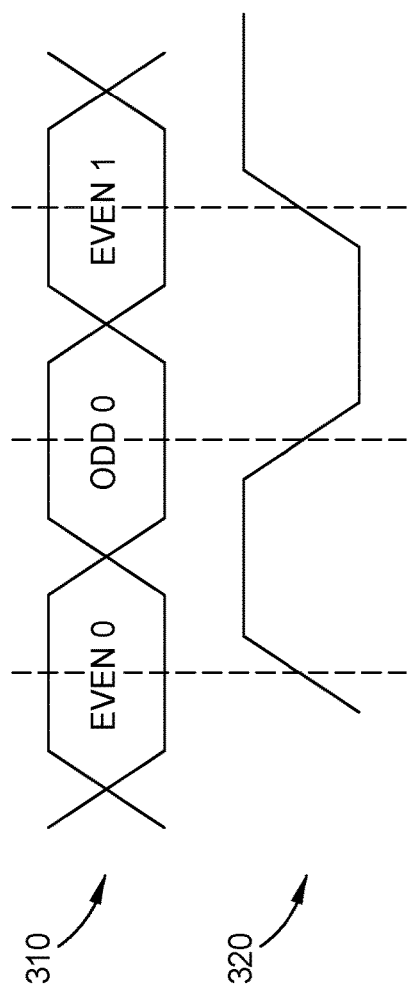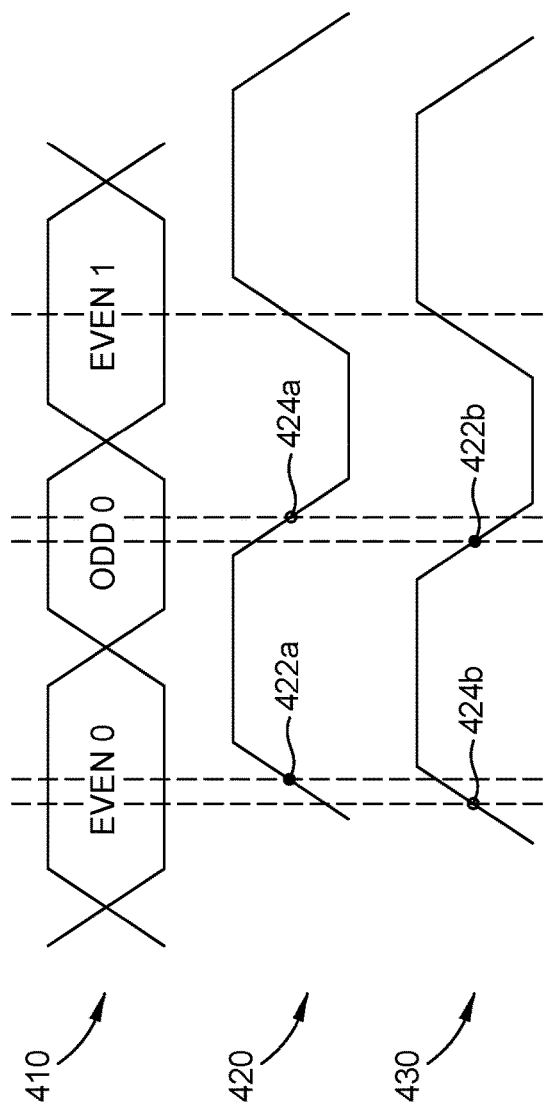

|  | dcastrength[4:0] | dcafine[3:0] |
|---|---|---|
| DECREASE DUTY CYCLE | reserved | reserved |
|  | reserved | reserved |
|  | reserved | reserved |
|  | reserved | 4'hE |
|  | reserved | 4'hD |
|  | 5'h14 | 4'hC |
|  | 5'h13 | 4'hB |
|  | 5'h12 | 4'hA |
|  | 5'h11 | 4'h9 |
| DEFAULT | 5'h00 | 4'h0 |
| INCREASE DUTY CYCLE | 5'h01 | 4'h1 |
|  | 5'h02 | 4'h2 |
|  | 5'h03 | 4'h3 |
|  | 5'h04 | 4'h4 |
|  | reserved | 4'h5 |
|  | reserved | 4'h6 |
|  | reserved | reserved |
|  | reserved | reserved |
|  | reserved | reserved |

FIG. 9

| dcamode | dcastrength[4:0] | signed | i_pstrengthctl[1:0] | i_nstrengthctl[1:0] | i_pstrengthctl[3:2] | i_nstrengthctl[3:2] |
|---|---|---|---|---|---|---|
| 1 | 10100 | -4 | 11 | 11 | 00 | 00 |
| 1 | 10011 | -3 | 10 | 11 | 00 | 00 |
| 1 | 10010 | -2 | 10 | 11 | 00 | 01 |
| 1 | 10001 | -1 | 10 | 11 | 00 | 11 |
| 1 | 00000 | 0 | 00 | 11 | 10 | 11 |
| 1 | 00001 | 1 | 00 | 01 | 10 | 11 |
| 1 | 00010 | 2 | 00 | 00 | 10 | 11 |
| 1 | 00011 | 3 | 00 | 00 | 11 | 11 |
| 1 | 00100 | 4 | 00 | 11 | 00 | 11 |
| 0 | don't care | | 00 | 11 | 00 | 11 |

| dcamode | dcafine[3:0] | signed | i_pfinect[5:3] | i_nfinect[5:3] | i_pfinectl[2:0] | i_nfinectl[2:0] | Notes |
|---|---|---|---|---|---|---|---|
| 1 | 1110 | -6 | 111 | 111 | 000 | 000 | |
| | 1101 | -5 | 111 | 111 | 100 | 000 | |
| | 1100 | -4 | 111 | 011 | 100 | 000 | |
| | 1011 | -3 | 111 | 001 | 100 | 000 | |
| | 1010 | -2 | 111 | 001 | 110 | 000 | |
| | 1001 | -1 | 111 | 000 | 111 | 000 | |
| | 0000 | 0 | 111 | 000 | 111 | 000 | Default configuration |
| | 0001 | 1 | 110 | 000 | 111 | 001 | |
| | 0010 | 2 | 100 | 000 | 111 | 001 | |
| | 0011 | 3 | 100 | 000 | 111 | 001 | |
| | 0100 | 4 | 100 | 000 | 111 | 011 | |
| | 0101 | 5 | 000 | 000 | 111 | 111 | |
| | 0110 | 6 | 000 | 111 | 000 | 111 | |
| 0 | don't care | | | | | | Bypass mode |

DUTY CYCLE ADJUSTMENT CIRCUIT WITH INDEPENDENT RANGE AND STEP SIZE CONTROL

RELATED APPLICATION

This application claims the benefit of U.S. provisional patent application Ser. No. 63/145,157, filed Feb. 3, 2021, which is hereby incorporated herein by reference.

TECHNICAL FIELD

The present disclosure generally relates to an integrated circuit (IC). In particular, the present disclosure relates to a system and method for providing a duty cycle adjustment with independent range and step size control.

BACKGROUND

High speed input/output (I/O) devices having a duty cycle of substantially 50 percent improves timing margins of the I/O devices. In various instances, the I/O devices operate with twice the frequency rate to partially mitigate the need for clock duty cycle correction and to employ a duty cycle of 50 percent. Such a method only uses rising edges of a clock signal instead of both rising and falling edges of a clock signal for timing closure. However, such a method has higher power and worse timing budgets as compared to I/O devices that operate at lower frequency rates.

In a dual-data rate system, both the rising and falling edges of a clock signal are used to sample a data signal, improving the speed at which the I/O devices are able to operate. A duty cycle of about 50 percent on both clock signal and data signal aids in accommodating increasing data transfer frequencies. For example, at a data rate of 7500 megabits per second (Mbps), assuming a 50 percent of duty cycle, each bit of data is transferred with a 133 pico-second (ps) unit interval (UI). Further, each bit of data is sampled using the clock signal at the center of the data eye with 66.5 ps of timing margin in either direction. However, ensuring that acceptable timing margins are preserved due to process, voltage, and temperature (PVT) variations in semiconductor manufacturing processes is very challenging. Additionally, the data and clock signals are forwarded from between semiconductor chips through packages, board(s), and/or connectors. Even in an ideal PVT situation, current implementations that use both the rising and falling edges of a clock signal to sample a data signal result in a very little available timing margin, increasing sampling errors within the corresponding system.

SUMMARY

In one example, duty cycle adjustment circuitry includes a first stage, a second stage, and decoder circuitry. The first stage includes a first strength tuning circuit having first inverter branches, and a first fine tuning circuit having second inverter branches. The first strength tuning circuit and the first fine tuning circuit are coupled in parallel. The second stage includes a second strength tuning circuit having third inverter branches, and a second fine tuning circuit having fourth inverter branches. The second strength tuning circuit and the second fine tuning circuit are coupled in parallel. Further, the second stage is electrically coupled to the first stage. The decoder circuitry is electrically coupled to the first stage and the second stage. The decoder circuitry controls the first strength tuning circuit independently from the first fine tuning circuit to adjust the duty cycle of an input signal received by the duty cycle adjustment circuitry.

In one example, duty cycle correction circuitry includes duty cycle adjustment circuitry and duty cycle control circuitry. The duty cycle adjustment circuitry has a first stage, a second stage, and decoder circuitry. The first stage has a first strength tuning circuit and a first fine tuning circuit. The second stage has a second strength tuning circuit and a second fine tuning circuit. The decoder circuitry is electrically connected to the first stage and the second stage. The decoder circuitry controls the first strength tuning circuit independently from the first fine tuning circuit. The duty cycle control circuitry is coupled to the duty cycle adjustment circuitry and is configured to adjust the first stage and the second stage to adjust the duty cycle of the input signal.

In one example, a method includes determining an upper fine value and a first strength value of two or more stages of duty cycle adjustment circuitry based on a comparison of a first output signal to a desired duty cycle percentage. The first output signal is generated by the duty cycle adjustment circuitry. Further, the method includes determining a lower fine value of the two or more stages of the duty cycle adjustment circuitry based on a comparison of a second output signal to the desired duty cycle percentage. The second output signal is generated by the duty cycle adjustment circuitry. The method further includes determining an average fine value based on the upper fine value and the lower fine value. Further, the method includes generating a third output signal by the duty cycle adjustment circuitry, by configuring the two or more stages of the duty cycle adjustment circuitry with the average fine value and the first strength value.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3 illustrates waveforms of example data and clock signals, according to one or more embodiments.

FIG. 4 illustrates waveforms of sample example data and clock signals, according to one or more embodiments.

FIG. 9 illustrates a table of an example decoder circuitry, according to one or more embodiments.

FIG. 10 illustrates a table of example strength codes, according to one or more embodiments.

FIG. 11 illustrates a table of example fine codes, according to one or more embodiments.

DETAILED DESCRIPTION

Figure 1:
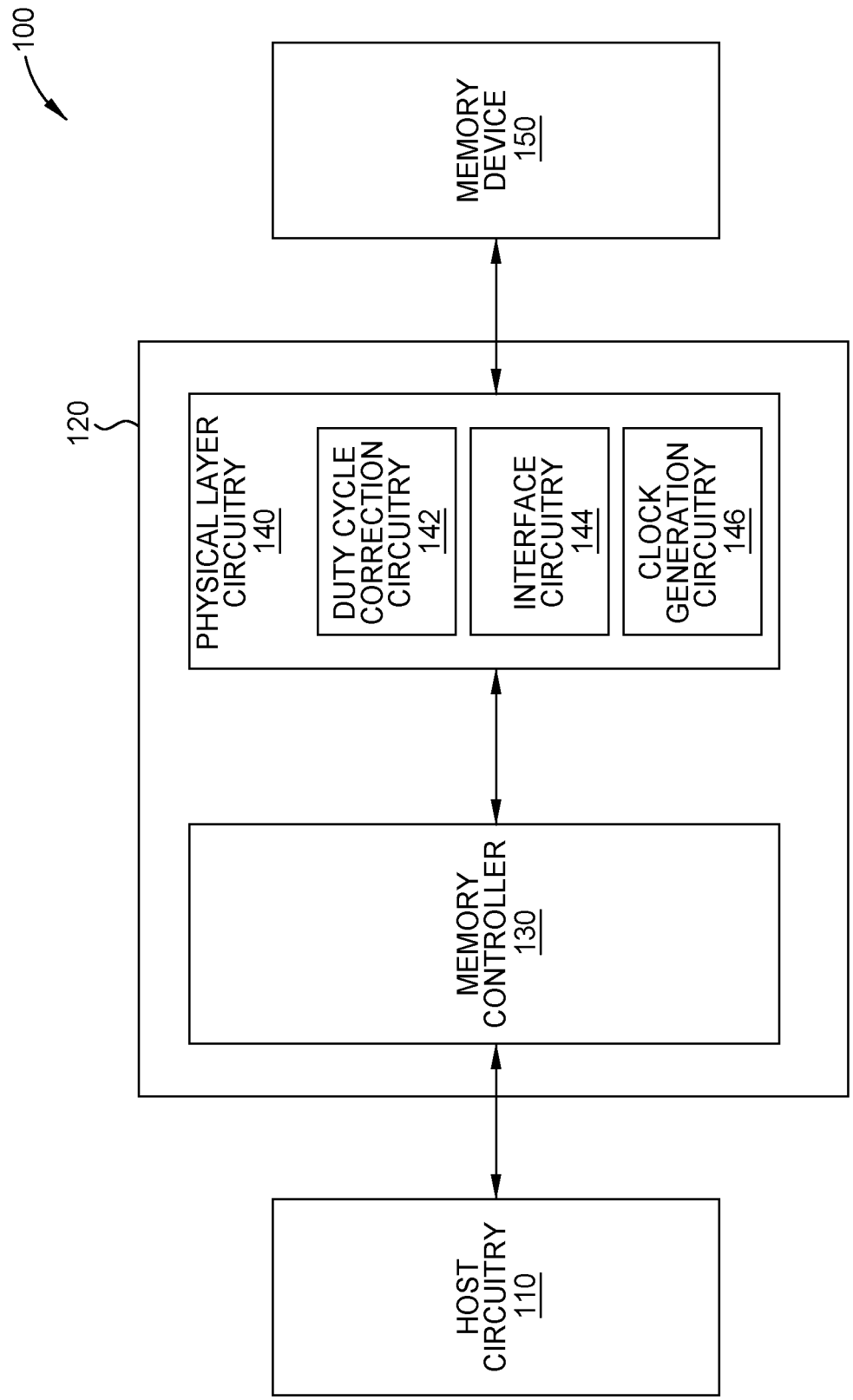
FIG. 1 illustrates a schematic block diagram of a processing system, according to one or more embodiments.

Aspects of the present disclosure relate to a duty cycle adjustment circuitry (DCA) with independent range and step size control. Input/Output (I/O) devices (or systems) and/or other device (or system) types utilize the edges of a clock signal to sample a data signal. Utilizing both the rising and falling edges allows the I/O devices to operate at higher frequencies. To improve the ability for I/O devices to operate at higher frequencies, the duty cycle of the clock signal and the data signal are maintained to be about 50 percent. Maintaining a clock signal of about 50 percent improves the sampling timing margin of the I/O devices.

DCA circuitries may also be utilized to send the data in dual-data rate with an improved (e.g., increased) timing margin, in wireline I/O and other systems. Traditional wireline systems use only the rising edge of the clock to send and receive the data signals. The falling edges of the clock signal are ignored. Thus, a portion of the data transfer bandwidth is wasted as only one bit of data can be transferred at a given clock cycle. However, if both the rising and falling edges of clock signal are used to transfer and sample data, the bandwidth is doubled in a given clock cycle. However, maintaining a close sampling timing is difficult as the data rate is increasing and the timing margin is decreasing. Moreover, when duty cycle is not perfect (e.g., not about 50%) in an I/O system, the timing margin decreases.

The following systems and methods are described for compensating for the timing margin loss with duty cycle adjustment (DCA) circuitry. The DCA circuitry of the present disclosure decouples controlling the tuning range from the resolution to improve the ability of the DCA circuitry to maintain the duty cycle of the clock signal (or any other input signal) to be at a selected duty cycle percentage. As will be described in greater detail in the following, tuning range corresponds to "strength code" and resolution corresponds to "fine code". The tuning range includes multiple different steps, where each step corresponds to a different strength code. Each strength code is associated with a resolution. Further, when the strength code is changed from a first strength code to a second strength code, the resolution (e.g., step size) of the first and second strength codes are substantially equal to each other. In one example, changing a strength code does not affect the resolution of the strength codes. For example, the strength codes may be adjusted to increase the tuning range. By decoupling the tuning range from the resolution, the strength codes can be adjusted without affecting the resolution (e.g., fine code) of each strength code. In typical approaches, increasing the tuning range negatively affects the resolution, negatively affecting the performance of the corresponding system. When combined with the calibration method of the present disclosure, the tuning range and resolution of the DCA circuitry can be adjusted independently from each other. Further, duty cycle of the output signal of the DCA circuitry can be updated glitch free in real time. Therefore, the output duty cycle at critical nodes within a larger system is improved, improving the system level flexibility as compared to typical methods that do not adjust the tuning range and resolution of DCA circuitry independently from each other.

In high-speed systems, as I/O data rates increase, systems are operated at lower internal clock frequencies and in a serialized fashion before the final I/O stages. Such an operating method utilizes a high fidelity system clock signal (e.g., a clock signal with about 50 percent duty cycle) as the clock signal directly affects the system operating margins. The aging of modern semiconductor processes has also become much more significant because of smaller feature sizes. Accordingly, the duty cycle of the clocking and data paths may experience significant duty cycle distortion after years (e.g., about 10 years) of operating stress depending on the input stress data pattern and corresponding stress conditions. In other words, the direction and the amount of the duty cycle drift due to such operating circumstances is unpredictable. Additionally, many I/O systems, including the clock signal outputs of memory systems, include a requirement for a 50 percent duty cycle within a range of margin of error in a range of about +/−2 percent. However, this requirement is difficult to satisfy at higher data rates based on typical DCA circuitry designs.

In contrast, technical advantages of the present disclosure include independently adjusting the tuning range and resolution of DCA circuitry. For example, the DCA circuitry includes stages that have strength tuning circuitry and fine tuning circuitry, which are controlled independently from each other via separate control signals. Accordingly, the tuning range of the DCA circuitry associated with the strength tuning circuitry can be independently adjusted from the resolution associated with the fine tuning circuitry. Independently adjusting turning range from the resolution, improves the ability of the DCA circuitry to adjust the duty cycle of signal which may carry a wider duty cycle distortion range without hurting the resolution as compared to a DCA circuitry that often increases the tuning range but at the expense of resolution.

FIG. 1 illustrates a schematic block diagram of a processing system, according to one or more embodiments. A processing system 100 includes host circuitry 110, memory sub-system 120, and memory device 150. The memory sub-system 120 is coupled to the host circuitry 110 and the memory device 150. In one example, the processing system 100 includes one or more integrated circuits (ICs). The host circuitry 110, the memory sub-system 120, and the memory device 150 may be part of a single IC or a part of two or more ICs. In one example, the processing system 100 includes one or more field programmable gate arrays (FPGAs) or application specific ICs (ASICs), among others. In one example, the processing system 100 is a system-on-chip (SoC).

The host circuitry 110 includes control logic to transmit data write requests and/or data read requests to and from the memory sub-system 120. The host circuitry 110 may include one or more processing devices (e.g., the processing device 1502 of FIG. 15).

The memory sub-system 120 receives data write and read requests from the host circuitry 110 and communicates the data write requests and data requests to the memory device 150. Further, the memory sub-system 120 receives data from the memory device 150 corresponding to the data requests received from the host circuitry 110. The memory subsystem 120 includes a memory controller 130 and a physical layer (PHY) circuitry 140.

Figure 15:
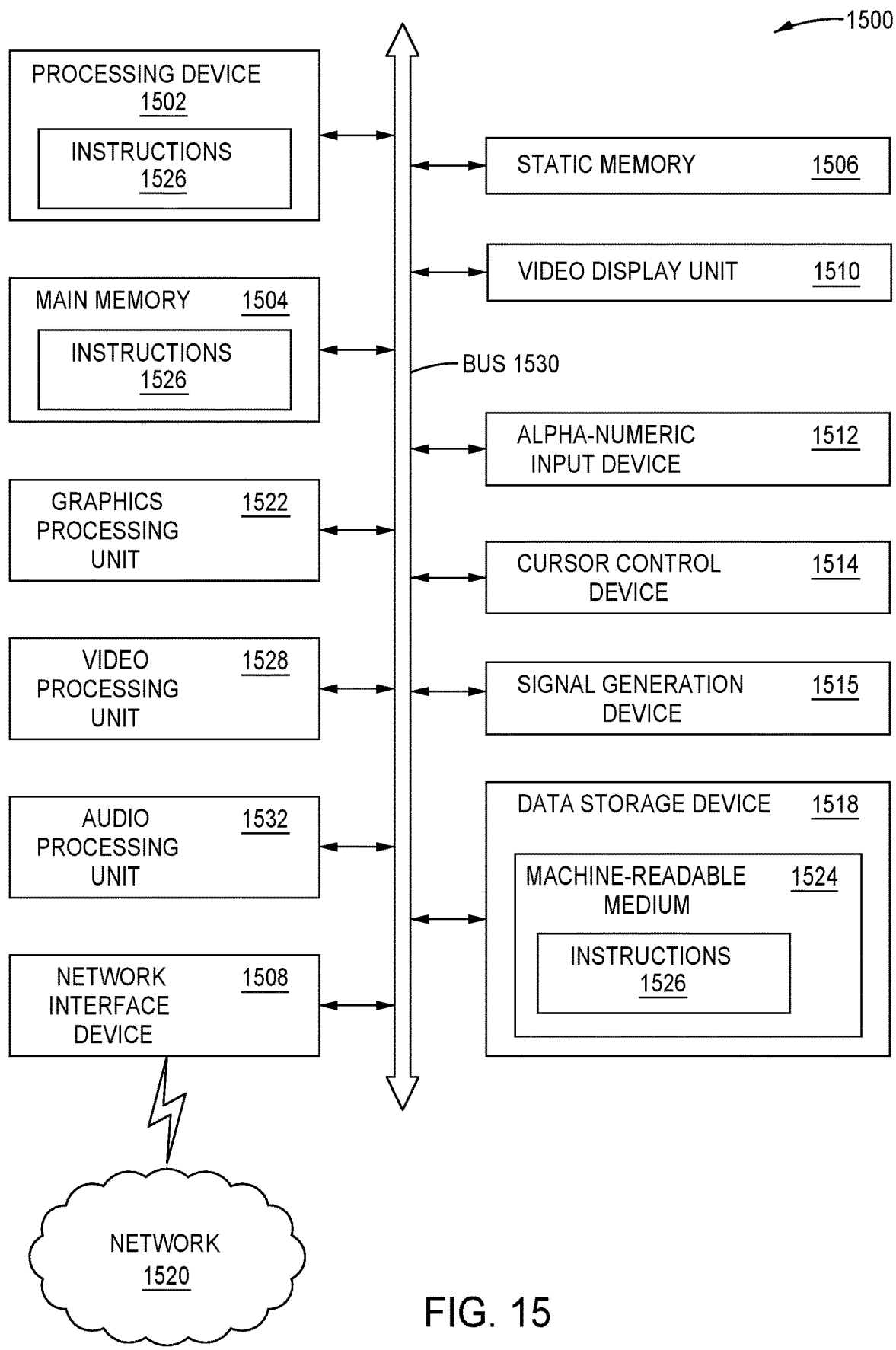
FIG. 15 depicts a diagram of an example computer system in which embodiments of the present disclosure may operate.

The memory controller 130 includes one or more processing devices (e.g., the processing device 1502 of FIG. 15). The memory controller 130 manages the flow of data to and from the memory device 150. In one example, the memory controller 130 reads and writes data to the memory device 150 based on the data read requests and the data write requests received from the host circuitry 110.

The PHY circuitry 140 communicates between the memory controller 130 and the memory device 150. The PHY circuitry 140 implements one or more communication protocols to control the communication between the memory controller 130 and the memory device 150. The PHY circuitry 140 includes duty cycle correction circuitry 142, interface circuitry 144, and clock generation circuitry 146. The duty cycle correction circuitry 142 generates one or more clock signals and communicates the clock signal or signals to the interface circuitry 144 and/or the memory controller 130. The interface circuitry 144 includes first-in-first-out (FIFO) buffers, memory physical layer interface (DFI), and address and data macro circuitry, among others. The interface circuitry 144 communicates data to and receives data from the memory device 150 based on a clock signal provided by the duty cycle correction circuitry 142. The clock generation circuitry 146 generates one or more clock signals used by the PHY circuitry 140 and/or the memory controller 130. In one example, the PHY circuitry 140 may include multiple duty cycle correction circuitries 142. Each of the data cycle correction circuitries 142 may correct the clock signals provided by the clock generation circuitry 146 and/or other signals (e.g., control signals and/or data signals, among others) of the memory controller 130.

The memory device 150 may be a random access memory (RAM). For example, the memory device 150 is a dynamic RAM (DRAM). Further, the memory device 150 is a synchronous DRAM (SDRAM). In one specific example, the memory device 150 is a double data rate SDRAM (DDR SDRAM). In other examples, the memory device 150 may be other types of memory devices. Further, the memory device 150 may be part of the same IC chip as the memory sub-system 120 or part of an IC chip separate from the memory sub-system 120.

Figure 2:
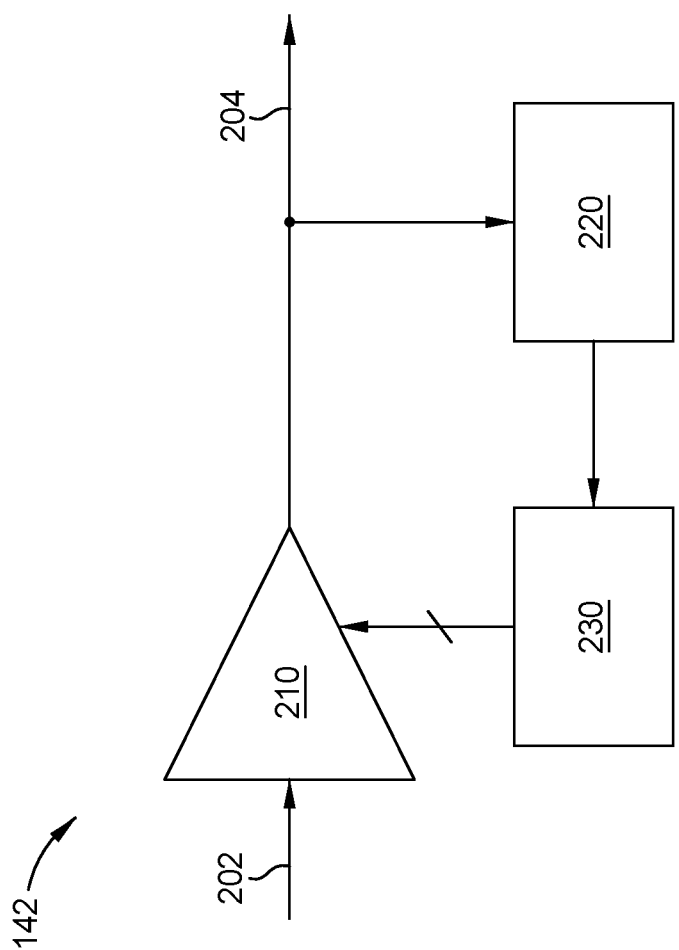
FIG. 2 illustrates an example system for measuring and adjusting duty cycle, according to one or more embodiments.

FIG. 2 illustrates an example system for measuring and adjusting duty cycle, according to one or more embodiments. Duty cycle correction circuitry 142 includes duty cycle adjustment (DCA) circuitry 210, duty cycle measurement (DCM) circuitry 220, and duty cycle control circuitry 230.

The DCA circuitry 210 receives an input signal 202 and reshapes the input signal 202 by adjusting the rising and/or falling edges of the input signal 202 to generate the output signal 204. In one example, the input signal 202 is a clock signal. In other examples, the input signal 202 is another type of signal. For example, the input signal 202 may be a control signal or a data signal, among others. Further, in the example where the input signal 202 is a clock signal, the corresponding output signal is a clock signal. In an example where the input signal 202 is a control signal or a data signal, the corresponding output signal 204 is a control signal or a data signal respectively. In such an example, the DCA circuitry 210 may be included in systems or circuitries other than clock generation circuitries.

The DCA circuitry 210 may generate the output signal 204 from the input signal 202 such that the output signal 204 has a duty cycle of about 50 percent. In one example, the input signal 202 is a clock signal and the output signal 204 is an adjusted clock signal with a duty cycle of about 50 percent.

FIG. 3 illustrates waveforms of example data and clock signals, according to one or more embodiments. A data signal 310 and a clock signal 320 have a 50 percent duty cycle. In such a case, the rising and falling edges of a clock signal 320 are used to sample both even data and odd data of the data signal 310, respectively, at the center of the data eye for each of the even and odd data portions of the data signal 310. Accordingly, the timing margin of FIG. 3 is improved for both edges of the clock signal 320. The timing margin corresponds to the amount of a pulse of the data signal 310 before and after when the pulse of a data signal is sampled.

When a processing system (e.g., the processing system 100) experiences duty cycle distortion within a clock signal or signals due to process, voltage, and temperature (PVT) variation and/or aging, the timing margin is reduced, and the data signal can be incorrectly sampled as a result. FIG. 4 illustrates waveforms of sample example data and clock signals, according to one or more embodiments. The waveforms include data signal 410 and clock signals 420 and 430. The data signal 410 is sampled using the clock signal 420 or the clock signal 430. In one or more examples, the clock signal 420 and the clock signal 430 are distorted such that the duty cycle of the clock signal 420 and the clock signal 430 is greater than or less than 50 percent. Further, the rising edge of the clock signal 420 is aligned with the middle of the eyes of the even data (EVEN0 and EVEN1), and the falling edge of the clock signal 430 is aligned with the middle of the eyes of the odd data (ODD0). Accordingly, either of the clock signal 420 or the clock signal 430 may be used to sample the data signal 410. However, neither of the clock signal 420 and 430 are aligned with the middle of the even and odd data at the same time. Accordingly, neither of the clock signal 420 nor the clock signal 430 are ideal clock signals that can be used to sample the data signal 410. As illustrated for the clock signal 420, the even data (EVEN 0 and EVEN 1) of a data signal 410 has a wider timing margin than the odd data (ODD 0) of the data signal 410, and the phase of a clock pulse of the clock signal 420 or 430 is wider than the negative phase of a clock pulse of the clock signal 420 or 430. Further, as illustrated for the clock signal 430, the odd data (ODD 0 and ODD 1) of a data signal 410 has a wider timing margin than the even data (EVEN 0) of the data signal 410, when the clock signal 430 is used as the sampling clock. In one or more examples, the timing shift (e.g., phase offset) between the data signal 410 and clock signals 420 and 430 may be adjusted such that a clock edge (e.g., a rising edge or falling edge) of the clock signal 420 or 430 can be placed at the center of a data eye (e.g., EVEN 0, ODD 0, and/or EVEN 1). However, in many typical clock generation circuitries only one of the rising edge or falling edge of a clock signal (e.g., the clock signal 420 or 430) may be improved (e.g., aligned with the center of a data eye) but not both.

In one or more examples, the data signal 410 may appear to have sufficient timing margin even when the clock isn't placed in the ideal center point of a data eye. However, additional factors such as skew and jitter may occur at each edge of the transfer of data and clock signals due to power supply induced noise, crosstalk effect, inter-symbol interference (ISI), and/or other random sources of noise. In practice, the actual data valid window is less than what as appears in FIG. 4. In FIG. 4, dots 422a, 422b indicate the calibrated or ideal sampling locations of the data signal 410 and the dots 424a, 424b indicate the non-ideal sampling locations as the dots 424a, 424b are not aligned (e.g., have a timing shift with reference to) the middle of the odd eye ODD 0 and the even eye EVEN 0, respectively. In one example, utilizing a DCA on both the clock and data paths may maximize the timing margin on each phase of the clock and data transfer. Such an implementation produces a balanced duty cycle of the clock signal and data signal, and improves the bit error rate (BER) of an I/O system operating at a high speed.

In typical DCA circuitries, there is a tradeoff between the tuning range and step size (or resolution) may hinder performance of the DCA circuitries. For a given area and power budget, when the duty cycle tuning range is wider, the step size is increased correspondingly. However, a large step size or a poor resolution negatively affects the timing budget and may introduce duty cycle errors. The DCA circuitry 210 decouples the tuning range and step size to provide an improved performance as compared to DCA circuitries that do not decouple the tuning range and step size. Accordingly, the DCA circuitry 210 is able to more accurately generate an output signal having about a 50 percent (or some other selected duty cycle percentage) as compared to other DCA circuitries. Further, processing systems including the DCA circuitry 210 are able to operate at higher operating frequencies with reduced operating power as compared to systems that include other types of DCA circuitries.

The DCA circuitry 210 adjusts the duty cycle of the input signal 202 by decoupling the tuning range and step size within the DCA circuitry 210. Accordingly, the performance of the DCA circuitry 210 is improved as compared to DCA circuitries that do not decouple the tuning range and step size control. In one example, the DCA circuitry 210 employs independent control of both the tuning range and the step size to compensate for performance variation due to large PVT variations and/or aging. In one or more examples, the DCA circuitry 210 may be a digital implementation, which may be integrated more easily using modern semiconductor processes, and has a smaller impact to power and area as compared to other DCA implementations. Further, in one or more example, the output duty cycle of the DCA circuitry 210 may be updated glitch free with a smooth transition of duty cycle at the output, increasing the system level flexibility.

Figure 5:
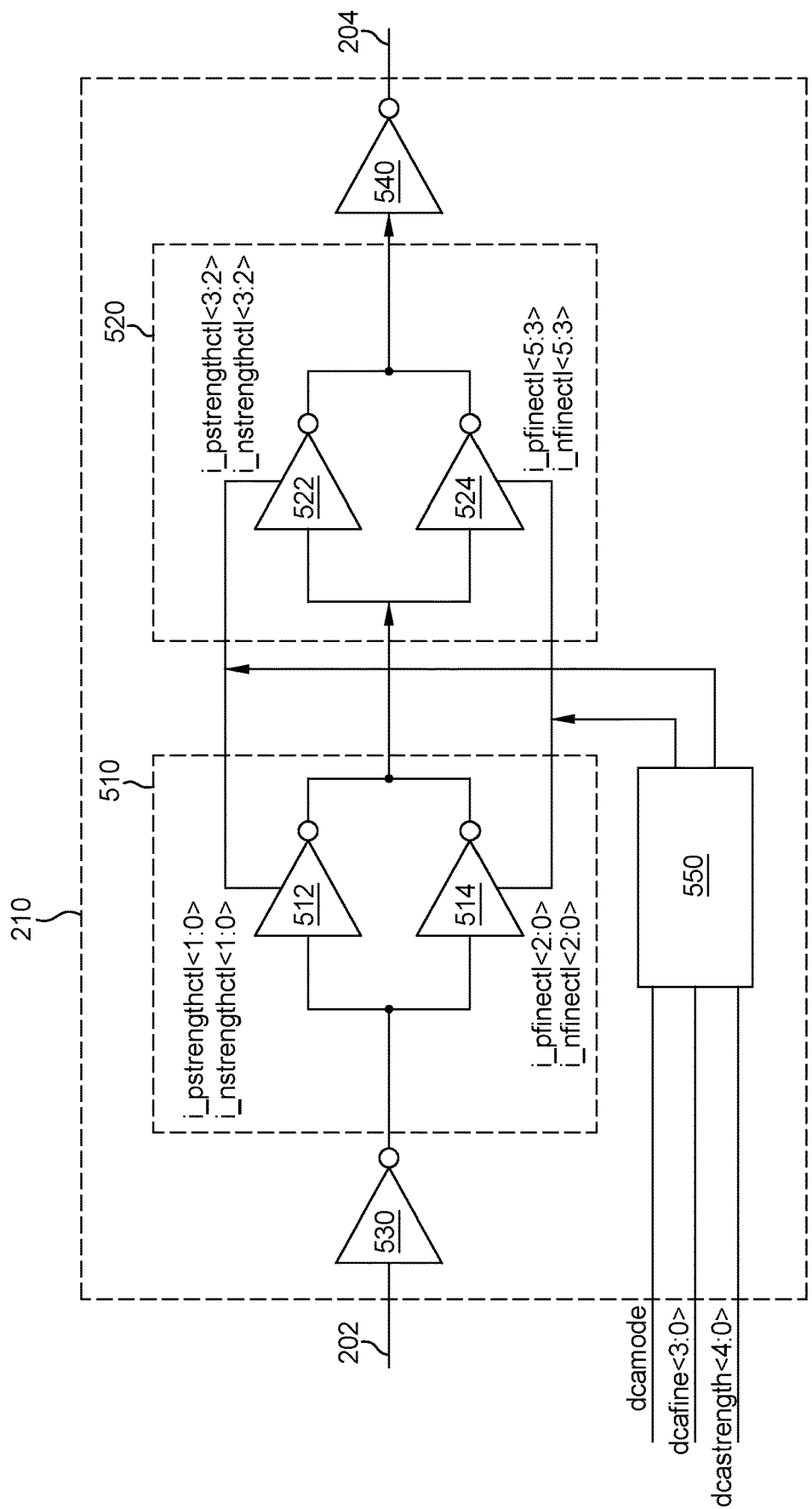
FIG. 5 illustrates an example diagram of duty cycle adjustment (DCA) circuitry, according to one or more embodiments.

FIG. 5 illustrates an example diagram of DCA circuitry 0, according to one or more embodiments. As is illustrated in FIG. 5, the DCA circuitry 210 includes two stages, stage 510 and stage 520, inverter 530, and inverter 540. However, in other examples, the DCA circuitry 210 can be extended to any number of stages. For example, the DCA circuitry 210 may include three or more stages. Each stage may be configured similar to that of the stage 510 and/or the stage 520.

Each stage 510 and 520 has a strength tuning circuit and fine tuning circuit with both inputs and outputs being shorted. For example, the stage 510 includes strength tuning circuit 512 and fine tuning circuit 514 and the stage 520 includes strength tuning circuit 522 and fine tuning circuit 524. The input of the strength tuning circuit 512 is electrically connected to the input of the fine tuning circuit 514. Further, the input of the strength tuning circuit 522 is electrically connected to the input of the fine tuning circuit 524. The strength tuning circuits 512 and 522 and the fine tuning circuits 514 and 524 adjust the duty cycle of an input signal based on control codes as is described in more detail in the following.

In one example, adjusting the strength tuning circuits 512 and 522, adjust the tuning range of the DCA circuitry 210. Further, adjusting the fine tuning circuits 514 and 524 adjust the resolution of the DCA circuitry 210.

The DCA circuitry 210 further includes decoder circuitry 550. The decoder circuitry 550 receives control signals dcamode, dcafine, and dcastrength. The dcamode control signal provides a mode to control whether a variable duty cycle adjustment is being performed. The dcafine control signal may refer to a fine control code. The dcastrength control signal may refer to a strength control code. The control signals dcamode, dcafine, and/or dcastrength may be single bit or multi bit signals. In one example, the decoder circuitry 550 generates the strength control signals i_pstrengthctl, i_nstrengthctl from the dcastrength control signal, and the fine control signals i_pfinectl and i_nfinectl from the dcafine control signal. Further, the mode of the DCA circuitry 210 is determined based on the value of the dcamode. For example, the DCA circuitry 210 is set to a mode to adjust the duty cycle based on the value of the dcamode control signal being a logical 1, and is set to a non-adjustment mode based on the value of the dcamode control signal being a logical 0.

The fine control signals i_pfinectl and i_nfinectl are multiple bit signals. For example, the fine control signals i_pfinectl and i_nfinectl include three bits. The strength control signals i_pstrengthctl and i_nstrengthctl are multiple bit signals. For example, the strength control signals i_pstrengthctl and i_nstrengthctl are binary signals. The strength control signals are received by the strength tuning circuits 512 and 522 and are used to configure the strength tuning circuits 512 and 522. The fine control signals are received by the fine tuning circuits 514 and 524 and are used to configure the fine tuning circuits 514 and 524. Configuring the strength tuning circuits 512 and 522, and the fine tuning circuits 514 and 524 adjusts the output current of the DCA circuitry 210 and duty cycle of the output signal. In one example, increasing the output current of the DCA circuitry 210 increases the duty cycle of the output signal.

Figure 6:
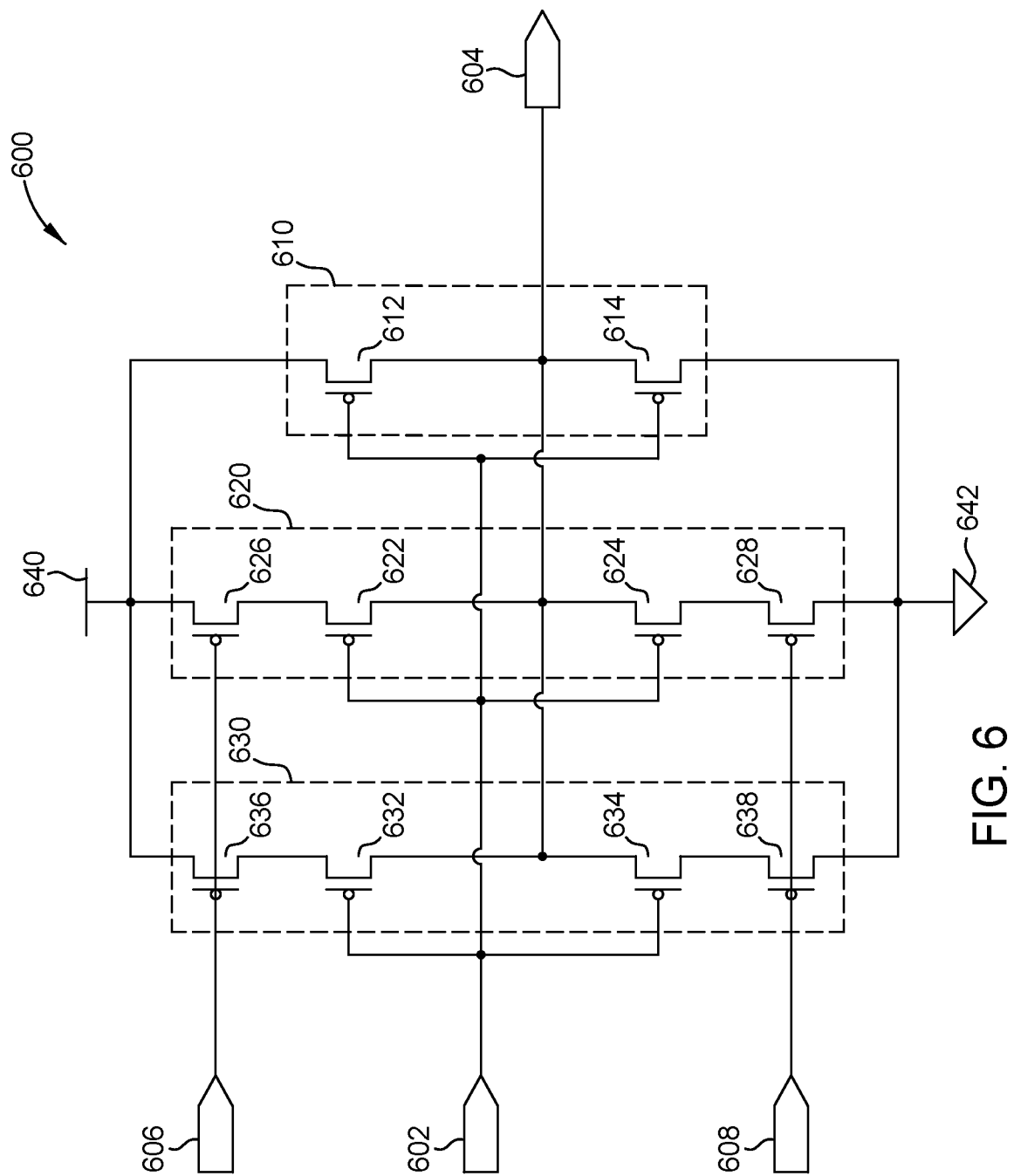
FIG. 6 illustrates a schematic diagram of an example strength tuning circuit, according to one or more embodiments.

FIG. 6 illustrates a schematic diagram of an example strength tuning circuit, according to one or more embodiments. The strength tuning circuit 512 and/or 522 (or the other strength tuning circuits of the DCA circuitry 210) may be configured similar to that of strength tuning circuit 600. The strength tuning circuit 600 includes multiple branches, e.g., branches 610, 620, and 630. The branches 610, 620 and 630 may be referred to as inverter branches. The branch 610 is an always-on branch. The branch 610 is not controlled by a control signal and operates as an inverter regardless of the value of the control signals received by the strength tuning circuit 600. For example, as the branch 610 is an always-on branch, the branch 610 functions to prevent glitches within the waveform of the output of the strength tuning circuit 600. The branch 610 includes transistor 612 and transistor 614. The transistor 612 is a PMOS transistor. The transistor 612 has a source connected to voltage node 640, a drain connected to the output node 604, and a gate connected to the input node 602. In one example, the transistor 614 is an NMOS transistor. The transistor 614 has a drain connected to the output node 604, a source connected to the reference voltage node 642, and a gate connected to the input node 602. In one example, the transistors 612 and 614 function as a complementary metal oxide semiconductor (CMOS) inverter. The voltage at the voltage node 640 is greater than the voltage at the reference voltage node 642. In one example, the voltage node 640 is connected to a power supply circuit that provides a power supply signal to the voltage node 640. The power supply circuit is part of or external to the processing system 100 of FIG. 1. In one example, the reference voltage node 642 is a ground voltage of the processing system 100 of FIG. 1.

The branches 620 and 630 are configurable branches. For example, the branches 620 and 630 may be turned on and off based on the control signals (e.g., the control signal i_pstrengthctl and i_nstrengthctl of FIG. 5) received at the control nodes 606 and 608 respectively.

The branch 620 includes transistors 622, 624, 626, and 628. The transistor 622 is a PMOS transistor. The transistor 622 has a source connected to the drain of the transistor 626, a drain connected to the output node 604, and a gate connected to the input node 602. The transistor 624 is an NMOS transistor. The transistor 624 has a drain connected to the output node 604, a source connected to the drain of the transistor 628, and a gate connected to the input node 602.

The transistors 626 and 628 enable or disable the branch 620 based on control signals received at the control nodes 606 and 608. For example, by turning the transistors 626 and 628 off, the branch 620 is turned off. Further, by turning the transistors 626 and 628 on, the branch 620 is turned on. The transistor 626 is a PMOS transistor. The transistor 626 includes a source connected to the voltage node 640, a drain connected to the source of the transistor 622, and a gate connected to the control node 606. The transistor 628 is an NMOS transistor. The transistor 628 has a source connected to the reference voltage node 642, a drain connected to the source of the transistor 624, and a gate connected to the control node 608. In one example, the transistors 622 and 624 function as a CMOS inverter.

In one example, turning the branch 620 off includes disconnecting the branch 620 from the voltage node 640 and the reference voltage node 642. Further, turning the branch 620 on includes connecting the branch 620 to the voltage node 640 or the reference voltage node 642.

Further, in one or more examples, the transistor 626 is turned on (e.g., connecting the transistor 622 with the voltage node 640) based on setting the control node 606 to a logic value of 0 (e.g., enabling the control node 606) while the transistor 628 is turned off (e.g., disconnecting the transistor 624 from the reference voltage node 642) based on setting the control node 608 to a logic value of 0 (e.g., disabling the control node 608). Accordingly, the top half of the branch 620 including the transistor 622 is turned on while the bottom half of the branch 620 including the transistor 624 is turned off. In other examples, the transistor 626 is turned off (e.g., disconnecting the transistor 622 from the voltage node 640) while the transistor 628 is turned on (e.g., connecting the transistor 624 with the reference voltage node 642). Accordingly, the top half of the branch 620 including the transistor 622 is turned off while the bottom half of the branch 620 including the transistor 624 is turned on.

The branch 630 includes transistors 632, 634, 636, and 638. The transistor 632 is a PMOS transistor. The transistor 632 has a source connected to the drain of the transistor 636, a drain connected to the output node 604, and a gate connected to the input node 602. The transistor 634 is an NMOS transistor. The transistor 634 has a drain connected to the output node 604, a source connected to the drain of the transistor 638, and a gate connected to the input node 602. The transistors 636 and 638 enable or disable the branch 630 based on control signals received at the control nodes 606 and 608. For example, by turning the transistors 636 and 630 off, the branch 630 is turned off. Further, by turning the transistors 636 and 638 on, the branch 630 is turned on. The transistor 636 is a PMOS transistor. The transistor 636 includes a source connected to the voltage node 640, a drain connected to the source of the transistor 632, and a gate connected to the control node 606. The transistor 638 is an NMOS transistor. The transistor 638 has a source connected to the reference voltage node 642, a drain connected to the source of the transistor 634, and a gate connected to the control node 608. In one example, the transistors 632 and 634 function as a CMOS inverter.

In one example, turning the branch 630 off includes disconnecting the branch 630 from the voltage node 640 and the reference voltage node 642. Further, turning the branch 630 on includes connecting the branch 630 to the voltage node 640 or the reference voltage node 642.

Further, in one or more examples, the transistor 636 is turned on (e.g., connecting the transistor 632 with the voltage node 640) while the transistor 638 is turned off (e.g., disconnecting the transistor 634 from the reference voltage node 642). Accordingly, the top half of the branch 630 including the transistor 632 is turned on while the bottom half of the branch 630 including the transistor 634 is turned off. In other examples, the transistor 636 is turned off (e.g., disconnecting the transistor 632 from the voltage node 640) while the transistor 638 is turned on (e.g., connecting the transistor 634 with the reference voltage node 642). Accordingly, the top half of the branch 630 including the transistor 632 is turned off while the bottom half of the branch 630 including the transistor 634 is turned on.

The control nodes 606 and 608 are connected to decoder circuitry (e.g., the decoder circuitry 550 of FIG. 5). The control node 606 receives a first control signal (e.g., i_pstrengthctl<1:0> or i_pstrengthctl<3:2>) and the control node 608 receives a second control signal (e.g., i_nstrengthctl<1:0> or i_nstrengthctl<3:2>) from the decoder circuitry 550. In one example, the first and second control signals may be logical compliments of each other. In another example, the first and second control signals are independent from each other. In such an example, the control nodes 606 and 608 may receive the first and second control signals, respectively, having the same value. In one or more examples, the first and second control signals are binary signals. The first and second control signals may be binary complementary signals. In an example where the control node 606 receives a first binary control signal, the transistor 626 and the transistor 636 receive a respective bit of the first binary control signal. For example, a first bit of the first binary control signal is received by the transistor 626 and a second bit of the first binary control signal is received by the transistor 636. Accordingly, the transistors 626 and 636 can be controlled independently from each other such that the corresponding branches 620 and 630 can be controlled independently from each other. Further, in an example where the control node 608 receives a second binary control signal, the transistor 628 and the transistor 638 receive a respective bit of the second binary control signal. For example, a first bit of the second binary control signal is received by the transistor 628 and a second bit of the second binary control signal is received by the transistor 638. Accordingly, the transistors 628 and 638 can be controlled independently from each other such that the corresponding branches 620 and 630 can be controlled independently from each other.

With reference to the branch 620, based on a corresponding bit of the first control signal having a logic value of 0 and the second control signal having a value of 1, the transistors 626 and 628 are turned on and the transistors 622 and 624 are connected to the voltage node 640 and the reference voltage node 642, respectively. Accordingly, the transistors 622 or 624 conduct a current which is output to the output node 604 based on the signal received as the input node 602. Further, based on a corresponding bit of the first control signal having a logic value of 1 and the second control signal having a logic value of 0, the transistors 626 and 628 are turned off and the transistors 622 and 624 are disconnected to the voltage node 640 and the reference voltage node 642, respectively. Accordingly, the transistors 622 or 624 do not conduct a current to the output node 604.

With reference to the branch 630, based on a corresponding bit of the first control signal having a logic value of 0 and the second control signal having a logic value of 1, the transistors 636 and 638 are turned on and the transistors 632 and 634 are connected to the voltage node 640 and the reference voltage node 642, respectively. Accordingly, the transistors 632 or 634 conduct a current which is output to the output node 604 based on the signal received as the input node 602 Further, based on a corresponding bit of the first control signal having a logic value of 1 and the second control signal having a logic value of 0, the transistors 636 and 638 are turned off and the transistors 632 and 634 are disconnected to the voltage node 640 and the reference voltage node 642, respectively. Accordingly, the transistors 632 or 634 do not conduct a current to the output node 604

The control signals received at the control nodes 606 and 608 may be multi-bit control signals. For example, the control signal received at the control nodes 606 and 608 have a bit associated for each of the branches 620 and 630. In one example, the control signals are binary signals. In one example, branches 620 and 630 are controlled by signals i_pstrengthctl<1:0> and i_nstrengthctl<1:0> via the control nodes 606 and 608. The signal controls are provided by decoder circuitry (e.g., the decoder circuitry 550 of FIG. 5).

In one example, the input node 602 receives the input signal. With reference to FIG. 5, the input signal and is received from the inverter 530. The branches 620 and 630 cover the duty cycle of tuning range of the DCA circuitry 210. For example, turning on one or more of the branches 620 and 630 increases the output current of the DCA circuitry 210, proportionally, increasing the duty cycle of the output signal (e.g., the output signal 204), proportionally.

In one or more examples, the branches 620 and 630 are programmed to determine rise and fall times for the output signal 204 under wide PVT variations and different operating frequencies of the corresponding processing system (e.g., the processing system 100). For example, the amount of delay provided to the strength tuning circuit 600 corresponds to the number of branches (e.g., the branches 620 and 630) that are turned on. For example, turning the branch 620 and the branch 630 off provides a first amount of delay as the branch 610 is always on, and functioning as an inverter. Turning the branch 620 on and the branch 630 off provides a second amount of delay, as the branches 610 and 620 function as inverters placed in parallel with each other. The second amount of delay is smaller than the first amount of delay. Further, turning the branch 620 and the branch 630 on provides a third amount of delay, as the branches 610, 620, and 630 are functioning as inverters in parallel with each other.

As is noted above, the branches 610, 620, and 630 may be enabled and disabled in different combinations to vary the delay of the strength tuning circuit 600. In one example, in a first mode (e.g., a first combination), the branches 620 and 630 are disabled, and the output edge rate (rise/fall time) of the output signal of the strength tuning circuit 600 has a first value. In the first mode, the output signal of the strength tuning circuit 600 is delayed by a first amount of delay. In a second mode (e.g., a second combination), the branch 620 is enabled and the branch 630 is disabled. In the second mode, the output edge rate (rise/fall time) of the output signal of the strength tuning circuit 600 has a second value that is smaller than the first value of the first mode and is sharper (faster) than the output edge rate of the first mode. Further, in the second mode, the output signal of the strength tuning circuit 600 is delayed by a second amount of delay that is greater than the first amount of delay.

In a third mode (e.g., a third combination), the branch 630 is enabled and the branch 620 is disabled. In the third mode, the output edge rate (rise/fall time) of the output signal of the strength tuning circuit 600 has a third value that is smaller than the second value and is sharper (faster) than the output edge rate of the second mode. Further, in the third mode, the output signal of the strength tuning circuit 600 is delayed by a third amount of delay that is greater than the second amount of delay.

In a fourth mode (e.g., a fourth combination), the branches 620 and 630 are enabled. In the fourth mode, the output edge rate (rise/fall time) of the output signal of the strength tuning circuit 600 has a fourth value that is smaller than the third value and is sharper (faster) than the output edge rate in the third mode. Further, in the second mode, the output signal of the strength tuning circuit 600 is delayed by a fourth amount of delay that is greater than the third amount of delay.

In the first, second, third, and fourth modes, the branch 610 is enabled, as the branch 610 is an always-on branch. However, in an example, where the branch 610 can be enabled and disabled, the output edge rate of the output signal of the strength tuning circuit 600 may be further adjusted by enabling and disabling the branch 610, generating additional modes having different combinations of the branches 610, 620, and 630 being enabled and disabled.

In one example, the branch 610 corresponds to a 1× inverter, the branch 620 corresponds to a 2× inverter, and the branch 630 corresponds to a 4× inverter. In such an example, by engaging the branches 610, 620, and 630 in a binary fashion, the edge rate tuning results in a delay in the output signal of the strength tuning circuit 600, which occurs in a linear fashion. Further, the branches 610, 620, and 630 are disabled and enabled in different combinations to vary the combined inverter size for the strength tuning circuit 600. In an example where the branches 610, 620, and 630 may be enabled and disabled, seven different combinations of enabling and disabling the branches 610, 620, and 630 are possible. Accordingly, seven different inverter strengths for the strength tuning circuit 600 may be formed. In an example as illustrated in FIG. 6, where the branch 610 is always-on, four different combinations of enabling and enabling the branches 620 and 630 are available, forming four different combined inverter strengths for the strength tuning circuit 600. The combined inverter strength of the strength tuning circuit 600 is the combined inverter strength of the enabled branches 610, 620, and 630. In an example where the branch 610 corresponds to a 1× inverter, the branch 620 corresponds to a 2× inverter, and the branch 630 corresponds to a 4× inverter, when each of the branches 610, 620, and 630 are enabled, the strength of the combined inverter of the strength tuning circuit 600 is 7×.

The 1× inverter of the branch 610 is associated with a first delay amount, the 2× inverter of the branch 620 is associated with a second delay amount, and the 4× inverter of the branch 630 is associated with a third delay amount. For example, the delay amount associated with 1× inverter is 40 ps, the delay amount associated with the 2× inverter is 36 ps, and the delay associated with the 4× inverter is 32 ps. The delay amounts of the 1× inverter, 2× inverter, and 4× inverter are separated by 4 ps steps. In other examples, the delay amounts of the inverters and/or the difference in delay amounts between the inverters differ from the above example. By varying different combinations of the branches 610, 620, and 630 that are enabled and disabled, the total combined delay of the strength tuning circuit 600 is varied.

In the above, the branches 610, 620 and 630 are described as being associated with 1×, 2×, and 4× inverters, respectively. However, in other embodiments, the factor of the inverters of the branches 610, 620 and/or 630 may be greater than or less than 1×, 2×, and ×4, respectively In one example, the factor of (e.g., the amount of delay provided by) the branches 620 and/or 630 ensures that the strength of the DCA covers a wide range of PVT variations and/or operating frequencies.

Figure 7:
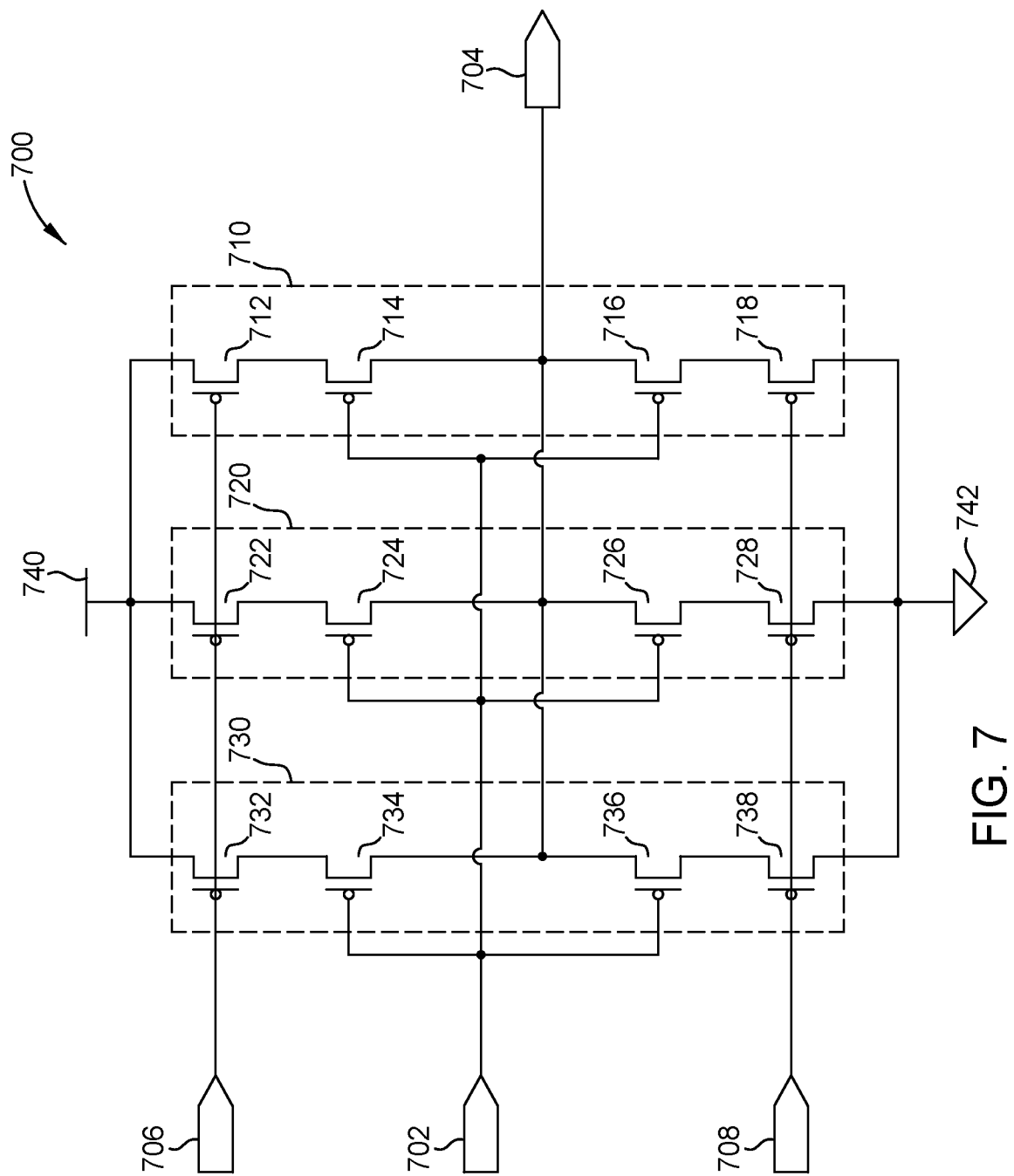
FIG. 7 illustrates a schematic diagram of an example fine tuning circuit, according to one or more embodiments.

FIG. 7 illustrates a schematic diagram of an example fine tuning circuit, according to one or more embodiments. The fine tuning circuit 514 and/or fine tuning circuit 524 may be configured similar to that of a fine tuning circuit 700. The fine tuning circuit 700 includes three branches 710, 720, and 730. The branches 710, 720, and 730 are configurable such that each of the branches 710, 720, and 730 may be turned on or turned off. The branches 710, 720, and 730 are configurable branches based on control signals received at the control nodes 706 and 708. The controls signals are provided by the decoder circuitry 550. In one or more examples, the branches 710, 720, and 730 may be referred to as inverter branches.

The branch 710 includes transistors 712, 714, 716, and 718. The transistor 712 is a PMOS transistor. The transistor 712 has a source connected to a voltage node 740, a drain connected to the source of the transistor 714, and a gate connected to the control node 706. The transistor 714 is a PMOS transistor. The transistor 714 has a source connected to the drain of the transistor 712, a drain connected to the output node 704, and a gate connected to the input node 702.

The transistor 716 is an NMOS transistor. The transistor 716 has a drain connected to the source of the transistor 714, a source connected to the drain of the transistor 718, and a gate connected to the input node 702. The transistor 718 is an NMOS transistor. The transistor 718 has a drain connected to the source of the transistor 716, a source connected to the voltage reference node 742, and a gate connected to the control node 708.

The transistors 712 and 718 enable or disable the branch 710 based on control signals received at the control nodes 706 and 708. For example, the transistors 712 and 718 turn the branch 710 on and off. Based on a corresponding bit of the control signal at the control node 706 having a logic value of 0 and the signal at the control node 708 having a logic value of 1, the branch 710 is turned on. Based on the branch 710 being turned on, the transistors 714 and 716 function as an inverter (e.g., a CMOS or other type of inverter). Based on the branch 710 being turned off, the transistors 714 and 716 do not function as an inverter.

The branch 720 includes transistors 722, 724, 726, and 728. The transistor 722 is a PMOS transistor. The transistor 722 has a source connected to a voltage node 740, a drain connected to the source of the transistor 724, and a gate connected to the control node 706. The transistor 724 is a PMOS transistor. The transistor 724 has a source connected to the drain of the transistor 722, a drain connected to the output node 704, and a gate connected to the input node 702.

The transistor 726 is an NMOS transistor. The transistor 726 has a drain connected to the source of the transistor 724, a source connected to the drain of the transistor 728, and a gate connected to the input node 702. The transistor 728 is an NMOS transistor. The transistor 728 has a drain connected to the source of the transistor 726, a source connected to the voltage reference node 742, and a gate connected to the control node 708.

The transistors 722 and 728 enable or disable the branch 710 based on control signals received at the control nodes 706 and 708. For example, the transistors 722 and 728 turn the branch 720 on and off. Based on the control signal at the control node 706 having a logic value of 0 and the signal at the control node 708 having a logic value of 1, the branch 720 is turned on. Based on the branch 720 being turned on, the transistors 724 and 726 function as an inverter (e.g., a CMOS or other type of inverter). Based on the branch 720 being turned off, the transistors 724 and 726 do not function as an inverter.

The branch 730 includes transistors 732, 734, 736, and 738. The transistor 732 is a PMOS transistor. The transistor 732 has a source connected to a voltage node 740, a drain connected to the source of the transistor 734, and a gate connected to the control node 706. The transistor 734 is a PMOS transistor. The transistor 734 has a source connected to the drain of the transistor 732, a drain connected to the output node 704, and a gate connected to the input node 702.

The transistor 736 is an NMOS transistor. The transistor 736 has a drain connected to the source of the transistor 734, a source connected to the drain of the transistor 738, and a gate connected to the input node 702. The transistor 738 is an NMOS transistor. The transistor 738 has a drain connected to the source of the transistor 736, a source connected to the voltage reference node 742, and a gate connected to the control node 708.

The transistors 732 and 738 enable or disable the branch 730 based on the control signals received at the control nodes 706 and 708. For example, the transistors 732 and 738 turn the branch 730 on and off. Based on a corresponding bit of the control signal at the control node 706 having a logic value of 0 and the signal at the control node 708 having a logic value of 1, the branch 730 is turned on. Based on the branch 730 being turned on, the transistors 734 and 736 function as an inverter (e.g., a CMOS or other type of inverter). Based on the branch 730 being turned off, the transistors 734 and 736 do not function as an inverter.

In one or more examples, the transistor 732 is turned on (e.g., connecting the transistor 734 with the voltage node 740) while the transistor 738 is turned off (e.g., disconnecting the transistor 736 from the reference voltage node 742). Accordingly, the top half of the branch 730 including the transistor 734 is turned on while the bottom half of the branch 730 including the transistor 736 is turned off. In other examples, the transistor 732 is turned off (e.g., disconnecting the transistor 734 from the voltage node 740) while the transistor 738 is turned on (e.g., connecting the transistor 736 with the reference voltage node 742). Accordingly, the top half of the branch 730 including the transistor 734 is turned off while the bottom half of the branch 730 including the transistor 736 is turned on. In one or more example, top and bottom half branches 710 and 720 may be similarly turned on and turned off independently from each other.

As the number of branches 710, 720, and 730 are turned on, the current of the output signal at the output node 704 increases. Further, the amount of tuning applied to an input signal (e.g., the input signal 202) increases. In one example, turning on two or more of the branches 710, 720, and 730 places the inventors of those branches in parallel to each other, increasing the current of the output signal. Accordingly, by increasing or decreasing the number of branches 710, 720, and 730 are turned on, the duty cycle of signal output by the corresponding DCA circuitry (e.g., the DCA circuitry 210 of FIG. 2) is adjusted.

The control signals received at the control node 706 and 708 may be multi-bit control signals. For each, the control signal received at the control nodes 706 and 708 have a bit associated for each of the branches 710, 720, and 730. In one example, branches 710, 720, and 730 are controlled by signals i_pfinectl<2:0> and i_nfinectl<2:0> via the control nodes 706 and 708. The control signals are provided by the decoder circuitry 550. In an example where the control node 706 receives a first multi-bit control signal, the transistor 712, the transistor 722, and the transistor 732 receive a respective bit of the first multi-bit control signal. For example, a first bit of the first multi-bit control signal is received by the transistor 712, a second bit of the first multi-bit control signal is received by the transistor 722, and a third bit of the first multi-bit control signal is received by the transistor 732. Accordingly, the transistors 712, 722, and 732 can be controlled independently from each other such that the corresponding branches 710, 720, and 730 can be controlled independently from each other. Further, in an example where the control node 708 receives a second multi-bit control signal, the transistor 718, the transistor 728, and the transistor 738 receive a respective bit of the second multi-bit control signal. For example, a first bit of the second multi-bit binary control signal is received by the transistor 718, a second bit of the second multi-bit control signal is received by the transistor 728, and a third bit of the second multi-bit control signal is received by the transistor 738. Accordingly, the transistors 718, 728, and 738 can be controlled independently from each other such that the corresponding branches 710, 720, and 730 can be controlled independently from each other.

In one or more examples, the control signals provided to the control nodes 706 and 708 and used to control the branches 710, 720, and 730 are independent from the control signals provided to the control nodes 606 and 608 that are used to control the branches 620 and 630. Accordingly, control of the branches 620 and 630 is independent from the control of branches 710, 720, and 730, and control of the fine tuning circuit 700 is independent from the control of the strength tuning circuit 600.

In one example, turning the branches 710, 720, and 730 off includes disconnecting the branches 710, 720, and 730 from the voltage node 640 and the reference voltage node 642. Further, turning the branches 710, 720, and 730 on includes connecting either the upper half of the bottom half of each of the branches 710, 720, and 730 to a respective one of the voltage node 640 and the reference voltage node 642.

In one or more examples, the input node 702 is connected to the input node 602 of FIG. 6. Accordingly, the input nodes 602 and 702 receive the same input signal, e.g., the signal i_dccin. The input signal is received from the inverter 530. Further, the output node 704 is connected to the output node 604 of FIG. 6.

With further reference to FIG. 5, the duty cycle of the input signal 202 is adjusted by changing the effective device sizes and the relative beta ratio of the PMOS and NMOS transistors of the strength tuning circuit and the fine tuning circuit of the stages 510 and 520. For example, with reference to FIGS. 6 and 7, by adjusting the number of branches 620 and 630 in the strength tuning circuit 600 and adjusting the number of branches 710, 720, and 730 in the fine tuning circuit 700, the effective size of the PMOS and NMOS transistors of the corresponding strength tuning circuit (e.g., the strength tuning circuit 512 or 522) and the fine tuning delay circuit (e.g., the fine tuning circuit 514 or 524) of the stage 510 and 520 is adjusted. As will be described in more detail in the following, changing the strength and fine codes changes the effective device sizes the PMOS and NMOS and the relative beta ratio of the PMOS and NMOS of the branches of the strength tuning circuit 512 and the fine tuning circuit 514, and/or the branches of the strength tuning circuit 522 and the fine tuning circuit 524.

With further reference to FIG. 5, an input to the DCA circuitry 210 is connected to a pre-conditioning inverter 530. The pre-conditioning inverter 530 receives the input signal 202 and reshapes the input signal 202 to update the rise and fall edge rate of the input signal 202 based on the size and ratio between the PMOS and NMOS of the pre-conditioning inverter 530. The output of the stage 520 of the DCA circuitry 210 is connected to an inverter 540. The inverter 540 has approximately the same size (e.g., device width) as that of the strength and fine stages 510 and 520, or 522 and 524 combined. The inverter 540 outputs output signal 204.

With further reference to FIG. 2, the DCM circuitry 220 is connected the output of the DCA circuitry 210, and the duty cycle control circuitry 230 to form a close loop system. In one example, delay circuit, and/or other circuit elements may be coupled between the output of the DCA circuitry 210 and the input of the DCM circuitry 220.

An input to the DCM circuitry 220 is connected to the output of the DCA circuitry 210. The DCM circuitry 220 determines if the duty cycle of the output signal 204 is greater or smaller than 50 percent. In one example, when the duty cycle of the output signal 204 is determined to be greater than 50 percent, the output from DCM circuitry 220 is asserted to a logical value of 1 (e.g., a high voltage value). Further, when the duty cycle of the output signal 204 is determined to be below 50 percent, the output of the DCM circuitry 220 is driven to a logical value of 0 (e.g., a low voltage value). The DCM circuitry 220 may be a differential comparator circuit. In other examples, the DCM circuitry 220 may be other types of circuits that are able to determine the difference in duty cycle between a signal and a reference duty cycle percentage. The functionality of the DCM circuitry 220 is described in greater detail in the following with regard to method 800 of FIG. 8 and/or the method 1200 of FIG. 13.

The duty cycle control circuitry 230 receives as an input the output voltage value from the DCM circuitry 220. The duty cycle control circuitry 230 adjusts the strength and fine codes provided to the DCA circuitry 210 based on the output received from the DCM circuitry 220. For example, one or more calibration methods are utilized by the duty cycle control circuitry 230 to determine the strength and fine codes until a targeted 50 percent duty cycle is achieve on the output signal 204. The calibration methods may include iterative loops of measuring the duty cycle of an output signal and adjusting the strength and fine control codes provided to the DCA circuitry 210 to maintain the duty cycle of the output signal to be about 50 percent (or some other duty cycle reference value). The calibration methods are described in greater detail with regard to the method 800 of FIG. 8 and the method 1200 of FIG. 13.

The duty cycle control circuitry 230 includes one or more processing devices (e.g., the processing device 1502 of FIG. 15) that is executes instructions (e.g., instructions 1526 of FIG. 15) stored a memory (e.g., the main memory 1504 or machine-readable medium 1524 of FIG. 15). In one example, one or more processors of the duty cycle control circuitry 230 executes instructions stored in a memory to calibrate the DCA circuitry 210 based on the method 800 of FIG. 8 and/or the method 1200 of FIG. 13.

Figure 8:
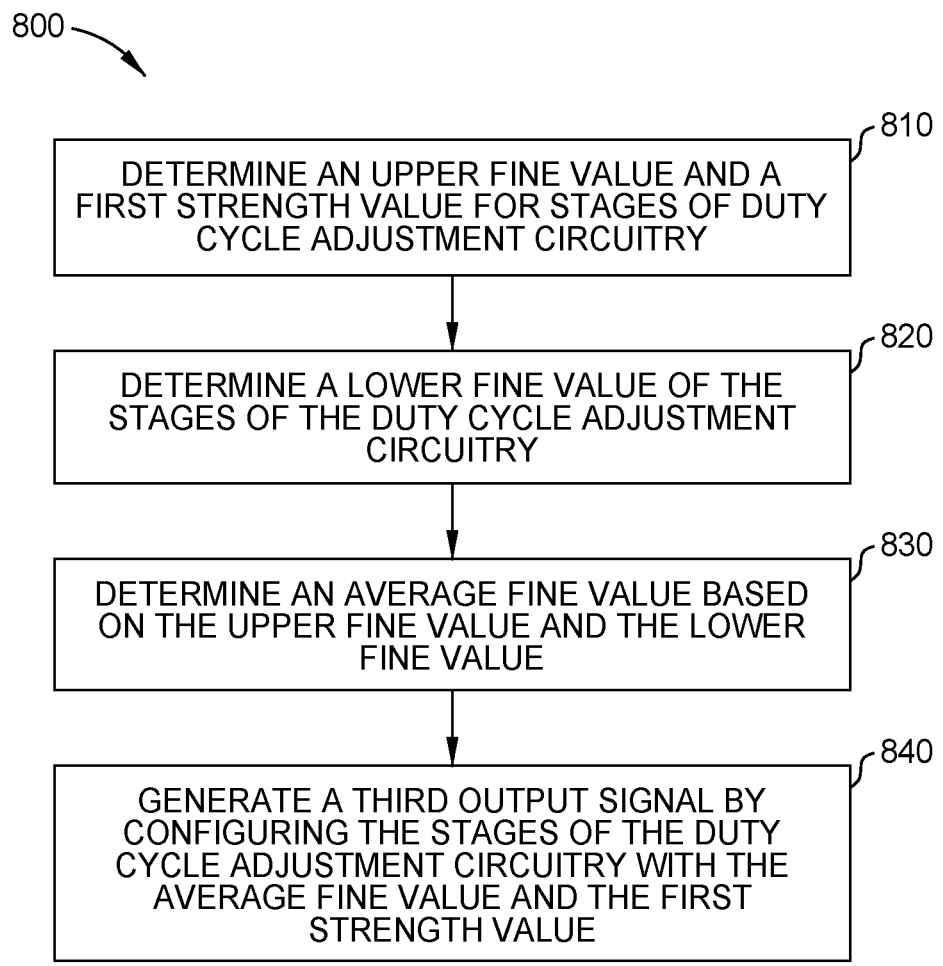
FIG. 8 illustrates a flow chart of a method of calibrating DCA circuitry, according to one or more examples.

FIG. 8 illustrates a flowchart of a method of calibrating DCA circuitry, according to one or more embodiments. A method 800 may be performed by one or more processors of the duty cycle control circuitry 230 executing instructions stored in a memory. At 810 of the method 800, an upper fine value and a first strength value for stages of the DCA circuitry 210 are determined. The upper fine value is a fine control code (e.g., dcafine<3:0> of FIG. 5) and the first strength value is a strength control code (e.g., dcastrength<4:0> of FIG. 5). The fine control codes and the strength control codes are illustrated in FIGS. 9, 10, and 11 and are described in greater detail in the following. In one example, the upper fine value and the first strength value correspond to the control signals i_pfinectl, i_nfinectl, i_pstrengthctl, and i_nstrengthctl. The control signals i_pstrengthctl and i_nstrengthctl and the control signals i_pfinectl, and i_nfinectl are multi-bit signals. In one example, the number of bits of the control signals i_pstrengthctl and i_nstrengthctl is less than the number of bits of the control signals i_pfinectl, and i_nfinectl. For example, the control signals i_pstrengthctl and i_nstrengthctl are binary control signals and the control signals i_pfinectl, and i_nfinectl are multi-bit control signals having more than two bits (e.g., three bits). In other examples, the number of bits of the control signals i_pstrengthctl and i_nstrengthctl may be equal to or greater than the number of bits of the control signals i_pfinectl, and i_nfinectl. In one example, the number of bits of the controls signals i_pstrengthctl and i_nstrengthctl corresponds to the number of configurable branches within the strength tuning circuits (e.g., strength tuning circuits 512, 522 of FIG. 5). Further, the number bits of the control signals i_pfinectl, and i_nfinectl corresponds to the number of configurable branches within the fine tuning circuits (e.g., fine tuning circuits 514, 524 of FIG. 5).

The duty cycle control circuitry 230 determines the upper fine value and the first strength value based on a comparison of first output signal (e.g., the output signal 204) to a desired duty cycle percentage (e.g., 50 percent or another percentage). In one example, the duty cycle control circuitry 230 selects the upper fine value and the first strength value from the table 1000 of FIG. 10 and the table 1100 of FIG. 11. In one example, the DCM circuitry 220 determines the duty cycle of the output signal and compares the duty cycle to the desired duty cycle percentage. The process for determining the upper fine value and the first strength value are described in more detail with regard to method 1200 of FIG. 12.

At 820 of the method 800, a lower fine value for stages of the DCA circuitry 210 is determined. The duty cycle control circuitry 230 determines the lower fine value based on a comparison of an updated output signal to a desired duty cycle percentage (e.g., 50 percent or another percentage). In one example, the DCM circuitry 220 determines the duty cycle of the update output signal and compares that duty cycle to the desired duty cycle percentage. The lower fine value is a fine control code (e.g., dcafine<3:0> of FIG. 5). The fine control code is illustrated in FIGS. 9 and 11 and is described in greater detail in the following. In one example, the lower fine value and the first strength value correspond to the control signals i_pfinectl and i_nfinectl. The process for determining the lower fine value is described in more detail with regard to method 1200 of FIG. 12.

With regard to FIG. 5, the upper fine value, the lower fine value and the first strength value determine which of branches of the strength tuning circuit 512, the fine tuning circuit 514, the strength tuning circuit 522 and the fine tuning circuit 524 are turned on and which are turned off. The upper fine value and the lower fine value are each received by the decoder circuitry 550 as sequential versions of the signal dcafine<3:0>. For example, during a first period a first signal dcafine<3:0> having a first value is received by the decoder circuitry 550 as the upper fine values. During a second period a second signal dcafine<3:0> having a second value is received by the decoder circuitry 550 as the lower fine value. The first and second periods are sequential. The first strength value is received by the decoder circuitry 550 as the signal dcastrength<4:0>. The decoder circuitry 550 processes the values of the signals dcafine<3:0> and dcastrength<4:0> to determine the control signals (e.g., the signals i_pstrengthctl, i_nstrengthctl, i_pfineclt, and i_nfineclt) provided to the stages 510 and 520. Further, determining the upper fine value and the lower fine value includes iteratively setting the stage 510 and 520 to fine values and measuring the duty cycle of the output signal relative to the desired duty cycle percentage. An example of this process is described in greater detail with regard to the method 1200 of FIG. 12.

At 830 of the method 800, the average fine value is determined based on the upper fine value and the lower fine value. The duty cycle control circuitry 230 determines the average fine value by averaging the upper fine value and the lower value. In one example, determining the average fine value mitigates resolution and/or hysteresis issues that may occur when determining the upper fine value, the lower fine value, and the strength value. Determining the average fine value is further described with regard to the method 1200 of FIG. 12.

At 840 of the method 800, an output signal is generated based on the average fine value and the first strength value. For example, the duty cycle control circuitry 230 generates control signals based on the average fine value and the first strength value, e.g., signals dcafine<3:0> and dcastrength<4:0>. The decoder circuitry 550 of FIG. 5 processes the values of the signals dcafine<3:0> and dcastrength<4:0> to determine the control signals (e.g., the signals i_pstrengthctl, i_nstrengthctl, i_pfineclt, and i_nfineclt) provided to the stages 510 and 520. The stages 510 and 520 use the control signals i_pstrengthctl, i_nstrengthctl, i_pfineclt, and i_nfineclt to generate the output signal 204 from the input signal 202 by configuring the number of branches of the stages 510 and 520 that are turned on and off. The duty cycle control circuitry 230 stores the upper and lower fine codes, the average fine code, and the strength codes are saved in a memory (e.g., the main memory 1504 or the machine-readable medium 1524 of FIG. 15).

FIG. 9 illustrates a table of an example decoder, according to one or more embodiments. Table 900 of FIG. 9 illustrates the strength and fine codes (dcastrength[4:0] and dcafine[3:0]) of the decoder circuitry 550. The default strength and fine codes are 5'h00 and 4'h0. The codes 5'h11-5'h14 and the codes 4'h9-4'hE correspond to a decrease in the duty cycle of an input signal. Further, the codes 5'h01-5'h04 and the codes 4'h1-4'h6 correspond to an increase in the duty cycle of the input signal. In one or more example, reserved entries may be used to expand the tuning range strength tuning circuits and/or the fine tuning circuits. For example, the reserved entries may be used to increase the maximum and/or minimum duty cycles within the tuning range of the strength training circuits and/or the fine tuning circuits. In one example, the reserved entries may be used to control additional branches within strength tuning circuits and/or fine tuning circuits. In other examples, the reserved entries may be used to control additional strength tuning circuits and/or fine tuning circuits.

FIG. 10 illustrates a table of example strength codes, according to one or more embodiments. FIG. 11 illustrates a table of example fine codes, according to one or more embodiments. Table 1000 of FIG. 10 and table 1100 of FIG. 11 provide details of the strength decoders and fine decoders respectively. FIG. 10 illustrates a table 1000 showing the values of the control signals i_pstrengthctl and i_nstrengthctl generated by the decoder circuitry 550 of FIG. 4. For example, with reference to FIG. 5, the table 1000 includes codes i_pstrengthctl<1:0> and i_nstrengthctl<1:0> that control the strength tuning circuit 512 of the stage 510, and codes i_pstrengthctl<3:2> and i_nstrengthctl<3:2> that control the strength of the strength tuning circuit 522 of the stage 520 with reference to the control signal dcastrength [4:0]. In one example, the default configuration of the code dcastrength[4:0] is b'00000. In one or more examples, dcastrength[4:0] is the signed representation with the most significant bit (MSB) being the sign bit. Further, the control signal dcamode is the control signal specified by design constraints depending on the PVT variations and operating frequencies of the corresponding I/O system. The control signal dcamode controls whether or not the DCA circuitry 210 performs variable duty cycle adjustment or functions as a buffer and does not affect the output duty cycle adjustment. In one or more examples, based on the value of the control signal dcamode being set to 1, the DCA circuitry 210 performs duty cycle adjustment based on the value of the control signal dcastrength[4:0]. Further, based on the value of the control signal dcamode being set to 0, the DCA circuitry 210 functions as a buffer and does not alter the duty cycle of the output signal. Further, when the value of the control signal dcamode is 0, the value of the control signal dcastrength[4:0] does not affect the functionality of the DCA circuitry 210. Further, when the control signal dcamode has a value of 0, a bypass mode is entered. The bypass mode may be used for low frequency operations and/or fast corners where timing margin is large. The table 1000 may be stored within a memory (e.g., the main memory 1504 of FIG. 15). The "signed" column of table 1000 depicts the 2's complement value of the control signal dcastrength[4:0] as a signed decimal value.

FIG. 11 illustrates the table 1100 illustrating the fine decoder control signals of the DCA circuitry 210. The table 1100 includes control signals i_pfinectl[2:0] and i_nfinectl[2:0] that are generated by the decoder circuitry 550 to control the fine tuning circuit 514 of the stage 510, and the control signals i_pfinectl [5:3] and i_nfinectl [5:3] that are generated by the control signal dcafine[3:0] to control the fine tuning circuit 524 of the stage 520. In one example, the default configuration is b'0000. Further, the control signal dcafine[3:0] is a signed binary representation with the MSB being the sign bit. The table 1100 may be stored within a memory (e.g., the main memory 1504 of FIG. 16). The "signed" column of table 1100 depicts the 2's complement value of the control signal dcafine[3:0] as a signed decimal value.

The codes of tables 900, 1000 and 1100 are used to generate the control signals i_pstrengthctl, i_nstrengthctl, i_pfinectl, and i_nfinectl for the stages 510 and 520. In one example, the duty cycle control circuitry 230 of FIG. 2 generates a control signal dcastrength having a strength code value corresponding to the control signal dcastrength[4:0] selected from the table 1000 and a control signal dcafine having a fine code value corresponding to the control signal dcafine[3:0] selected from the table 1100. The duty cycle control circuitry 230 communicates the control signals dcastrength and dcafine to the decoder circuitry 550 of FIG. 5. The decoder circuitry 550 decodes the codes of the control signals dcastrength and dcafine based on one or more of the tables 900, 1000 and 1100 to determine the control signals i_pstrengthctl, i_nstrengthctl, i_pfinectl, and i_nfinectl. In various examples, the codes marked as reserved may be updated with values in other implementations. For example, the reserved codes may be used to expand the tuning range of the strength tuning circuits (e.g., the strength tuning circuits 514 and 524 of FIG. 5). The reserved entries may be used to increase the maximum and/or minimum duty cycles within the tuning range of the strength training circuits. In one example, the reserved entries may be used to control additional branches within strength tuning circuits and/or additional strength tuning circuits. Further, the number of bits within the controls signals i_pstrengthctl, i_nstrengthctl, i_pfinectl, and i_nfinectl corresponds to the number of branches within the strength tuning circuits 512, 522 of FIG. 5, and the fine tuning circuits 514, 524 of FIG. 5. For example, the control signal dcastrength is decoded by the decoder circuitry 550 into the control signals i_pstrengthctl, and i_nstrengthctl, and the number of bits within the control signal i_pstrengthctl, and i_nstrengthctl corresponds to the number of branches within strength tuning circuits 512 and 522. Further, the control signal dcafine is decoded by the decoder circuitry 550 into the control signals i_pfinectl, and i_nfinectl, and the number of bits within the control signal i_pfinectl, and i_nfinectl corresponds to the number of branches within strength tuning circuits 514 and 524.

Figure 12:
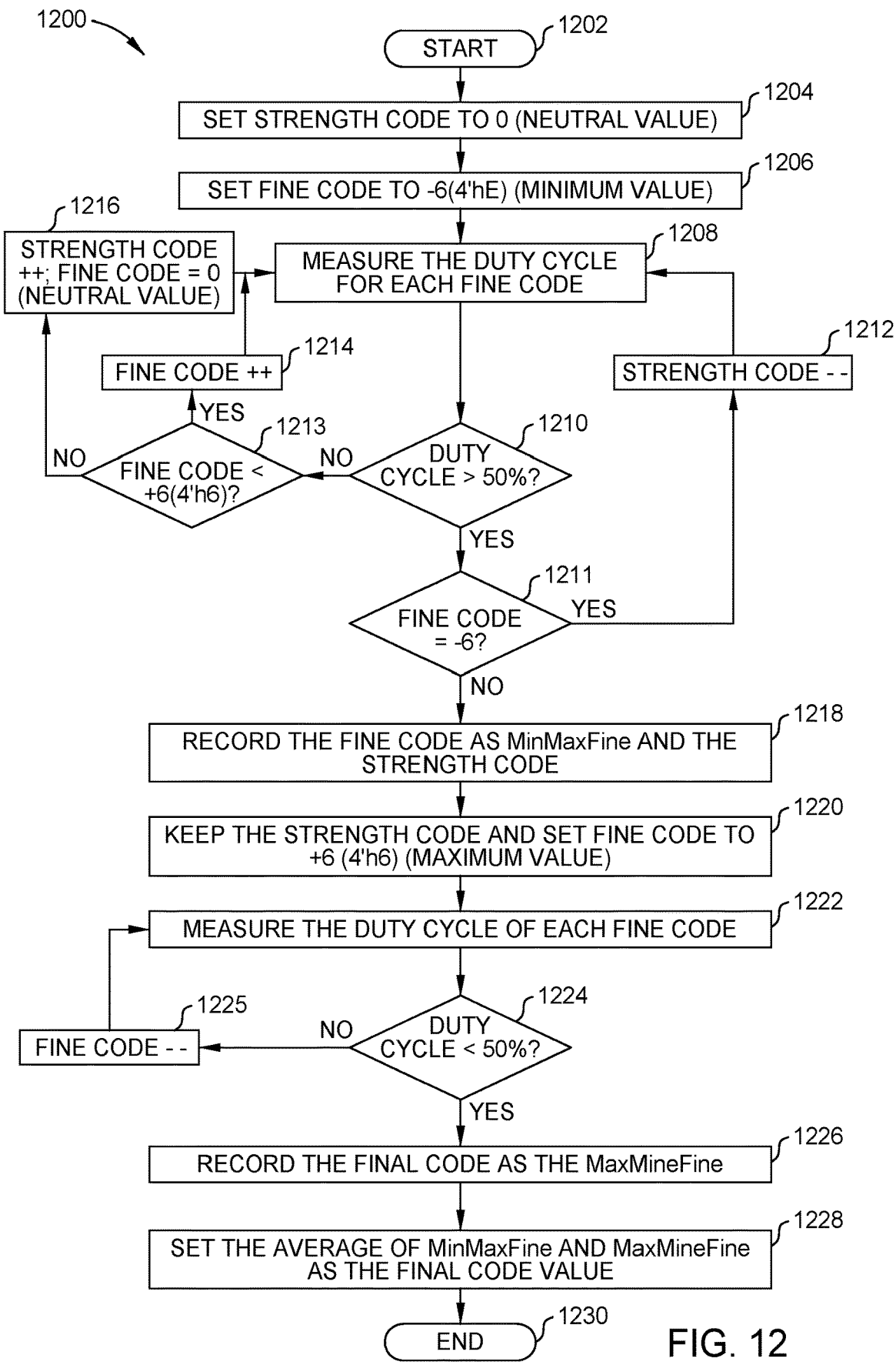
FIG. 12 illustrates a flow chart of an example method for adjusting a duty cycle, according to one or more embodiments.

FIG. 12 illustrates a flowchart of an example method for adjusting a duty cycle, according to one or more embodiments. A method 1200 for training (e.g., calibrating or tuning) DCA circuitry (e.g., DCA circuitry 210) is executed by the duty cycle control circuitry 230 based on an output provided by the DCM circuitry 220. In one example, one or more processors (e.g., the processing device 1502 of FIG. 16) of the duty cycle control circuitry 230 executes the method 1200 by executing instructions (e.g., instructions 1526 of FIG. 16) stored in a memory (e.g., the main memory 1504 or the machine-readable medium 1524 of FIG. 16).

At 1202 of method 1200, the method 1200 starts (i.e., begins). At 1204 of the method 1200, the duty cycle control circuitry 230 sets the strength code to 0 (i.e., a 5'h00 of table 900, or code b'00000 of FIG. 10).

Figure 13:
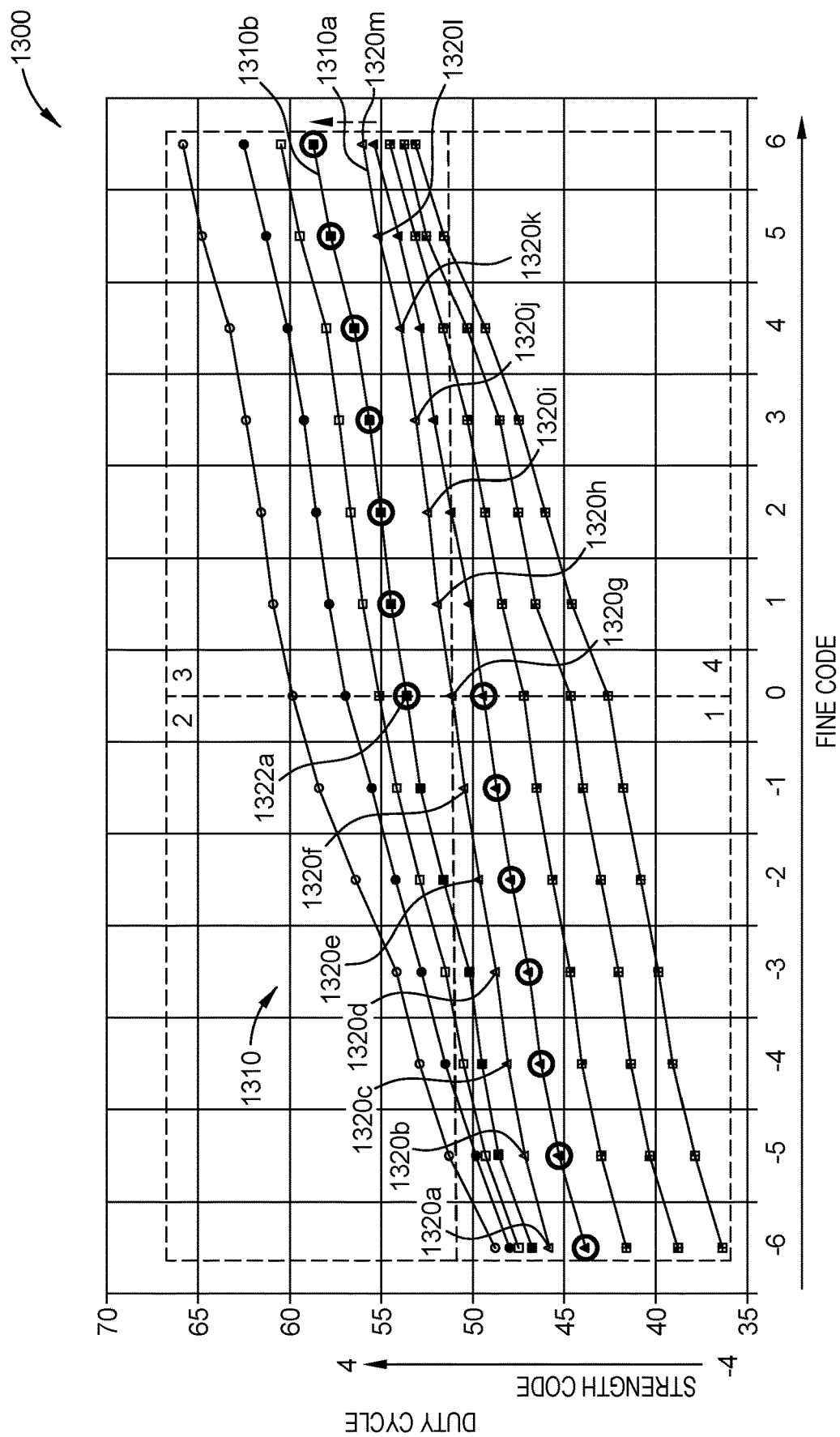
FIG. 13 illustrates example strength lines, according to one or more embodiments.

FIG. 13 illustrates example strength lines, according to one or more embodiments. With reference to FIG. 13, a strength line 1310a of the graph 1300 is selected. FIG. 13 illustrates the graph 1300 indicating examples of the tuning range and step size (resolution) of the DCA circuitry 210. In one example, the DCA circuitry 210 has a strength code ranging from −4 to 4 represented by each line on the graph 1300. The DCA circuitry 210 has a fine code ranging from −6 to 6 represented by each dot on a line along the x-axis of the graph 1300. The y-axis shows the percentage of duty cycle. As illustrated, the design of the DCA circuitry 210 of FIG. 2 covers a range of duty cycle between 36.42% and 65.83%. In other examples, different designs of the DCA circuitry 210 of FIG. 2 may cover other duty cycle ranges. For example, DCA circuitries that include more than two stages may cover duty cycles of less than about 36% and/or greater than about 66%.

As illustrated in the graph 1300, for a given duty cycle point within the covered range, indicated by the y-axis, a duty cycle can be reached by one or more strength and fine code combinations due to the overlapping nature of strength lines 1310 of the graph 1300. For example, the lines of the graph 1300 are compressed given the duty cycle range that is covered. Further, the design can be modified by the device sizes so that strength lines 1310 are spread apart further from each other to cover a wider range of duty cycle distortion so long as the maximum fine code of a given strength line is approximately equal or overlapping with the minimum fine code of the next strength line. Each strength line 1310 includes resolution points that correspond to the resolution of each strength line. Each of the strength lines 1310 corresponds to a different strength code and each of the resolution points along a strength line corresponds to a fine code. For example, each of the strength lines corresponds to a different strength code of the table 900 of FIG. 9 and each of the resolution points corresponds to a different fine code of the table 900 of FIG. 9.

The graph 1300 includes quadrants 1-4 (quadrant 1 corresponds to bottom left quadrant; quadrant 2 corresponds to top left quadrant; quadrant 3 corresponds to top right quadrant; and quadrant 4 corresponds to bottom right quadrant). Each of the quadrants 1-4 corresponds to different resolution points of the strength lines. The resolution points in each quadrant are a combination of the resolution points (fine codes) and the respective strength line (e.g., strength code). The step sizes in quadrants 1 and 3 are smaller and more uniform than those in quadrants 2 and 4. In graph 1300, the slopes in some quadrants of the strength lines 1310 are steeper than that of other regions. Specifically, the step sizes in the quadrants 2 and 4 are bigger, while in the step sizes in the quadrants 1 and 3 are smaller. The differences in the step sizes is due to the nature of the beta ratio and interaction between effective PMOS and NMOS transistor sizes. To utilize the design with finer step sizes, the method 800 and/or the method 1200 may use only the codes in quadrants 1 and 3 of the graph 1300. In one example, the loop of method 1200 including 1210-1216, the loop of method 1200 including 1210-1212, and/or the loop of method 1200 including 1224 and 1225 may be utilized ensure that the codes in quadrants 1 and 3 of the graph 1300 are used. In one example, the method 1200 uses the of the graph 1300 quadrants with finer step sizes.

At 1206 of the method 1200, the duty cycle control circuitry 230 sets the fine code to a minimum value. For example, with reference to the table 900 of FIG. 9, the fine code is set to 4'hE, or with reference to the table 1100 of FIG. 11, the fine code is set to −6 (b'131). With reference to the graph 1300 of FIG. 13, a minimum value (e.g., value 1320a) along the strength line 1310a is selected as the fine code.

At 1208 of the method 1200, the DCM circuitry 220 measures the duty cycle of the output signal 204 for a value 1320 along the strength line 1310a. Each value 1320 (e.g., values 1320a-1320m) corresponds to a different fine code (e.g., a different code of table 900 or 1100), and the DCM circuitry 220 measures the duty cycle of the output signal 204 for the current value 1320 along the strength line 1310a. The duty cycle control circuitry 230 instructs the decoder circuitry 550 using control signals dcamode, dcafine, and dcastrength to control the values of the stages 510 and 520 of the DCA circuitry 210. Controlling the stages 510 and 520, controls the values of the strength tuning circuit 512 and the fine tuning circuit 514 of the stage 510, and strength tuning circuit 522 and fine tuning circuit 524 of the stage 520. Adjusting the values of the strength tuning circuits 512, 522, and the fine tuning circuits 514 and 524, adjusts the duty cycle of the output signal 204. For example, increasing the values of the strength tuning circuits 512 and 522, and the fine tuning circuits 514 and 524, increases the duty cycle of the output signal 204.

At 1210 of the method 1200, a determination is made as to whether or not the duty cycle for an output signal corresponding to a fine code measured at 1208 of the method 1200 is greater than 50 percent. In other examples, a duty cycle of greater than or less than 50 percent may be used. Further, the duty cycle of 1210 may be referred to as a desired duty cycle. In one example, the duty cycle measurement circuitry 220 of FIG. 2 determines whether or not the duty cycle for an output signal generated by a fine code measured at 1208 of the method 1200 is greater than 50 percent.

At 1213 of the method 1200, if the duty cycle is less than 50 percent, the duty cycle control circuitry 230 of FIG. 2 determines if the fine code is less than a maximum value (e.g., less than 4'h6 of dcafine[3:0] in table 900 or signed 6 of table 1100). With reference to FIG. 13, the maximum value corresponds to point 1320m along strength line 1310a.

If the fine code is less than a maximum value, the fine code is increased at 1214 of the method 1200. The process returns to 1208 of the method 1200, where the duty cycle of the output signal 204 is measured by the DCM circuitry 220 of FIG. 2 and a determination whether or not the measured duty cycle is greater than 50 percent. The fine code is increased by one step (fine code ++) or multiple steps depending on the step size. If the fine code is not less than a maximum value at 1213, the strength code is increased and the fine code is set to 0 (i.e., a neutral value) at 1216 of the method 1200. The strength code is increased by one step (strength code ++) or multiple steps depending on the step size. For example, the duty cycle control circuitry 230 of FIG. 2 increases the strength code and sets the fine code to 0. The duty cycle control circuitry 230 selects the strength line 1310b and sets the fine code to 1322a. The DCM circuitry 220 measures the duty cycle of the output signal 204 at 1208 of the method 1200 and determines whether or not the measured duty cycle is greater than 50 percent.

The loop including 1208, 1210, 1213, 1214, and 1216 is continued until a duty cycle of an output signal 204 generated from a fine code is greater than 50 percent. In one example, when increasing the strength code, the fine code is set to a default value, e.g., 4'h0 of table 900, 0000 of Table 1100, or to a value greater than the minimum value.

At 1210, based on a determination that the measured duty cycle is greater than 50 percent, a determination as to whether or not the fine code has a value of −6 of table 1100 (or 4'hE of table 900) is made at 1211 of the method 1200. At 1212 of the method 1200, based on a determination that the fine code is has a value of −6, the strength code is decreased by one or more steps, and the process returns to measuring the duty cycle of a corresponding output signal 204 generated by the DCA circuitry 210 at 1208 of the method 1200.

At 1218, based on the fine code not having a value of −6, the corresponding fine code is stored, e.g., stored as MinMaxFine value, or an upper fine value, within a memory device (e.g., the main memory 1504 of FIG. 15) by the duty cycle control circuitry 230 and the corresponding strength code is stored by the duty cycle control circuitry 230 within the memory device.

At 1220, the fine code is set to a maximum value (e.g., code 4'h6 of table 900 of FIG. 9, or a value of 6 of table 1100 of FIG. 11) and the strength code is maintained by the duty cycle control circuitry 230. The duty cycle of the corresponding output signal 204 is measured by the DCM circuitry 220 of FIG. 2. At 1224, and a determination as to whether or not the duty cycle is less than 50 percent. While a duty cycle of 50 percent is utilized in the example of FIG. 13, in other examples, duty cycles of less than or greater than 50 percent may be used. Further, the duty cycle percentage of 1224 may be referred to as a desired duty cycle. The duty cycle percentage of 1224 is equal to, less than, or greater to the duty cycle percentage of 1210. Based on the duty cycle not being less than 50 percent, the fine code value is decreased at 1225 of the method 1200 by one step and the duty cycle of the corresponding output signal 204 is measured at 1222 of the method 1200 by the DCM circuitry 220. In other examples, the fine code may be decreased by more than one step.

At 1226 of the method 1200, based on the determination that the duty cycle of the corresponding output signal 204 is less 50 percent, the final fine code is recorded as the MaxMineFine code value or a lower fine value. At 1228 of the method 1200, an average of the MinMaxFine and the MaxMineFine value is determined as a final fine code value. At 1230 of the method 1200, the method 1200 ends.

The method 1200 may be completed each time the processing system 100 of FIG. 1 boots up, in response to a change in operating temperature of the processing system 100 above a threshold value, a period of time, and/or in response to a control signal.

As is illustrated by the graph 1300 of FIG. 13, two or more of the strength lines 1310 have overlapping ranges, and two or more codes have overlapping ranges. Accordingly, in one or more examples, overlapped codes can be skipped during searching.

In one or more examples, a DCA circuitry (e.g., the DCA circuitry 210 of FIG. 2) is configured such that each strength line is spread apart further than that illustrated in FIG. 13 with less or no overlapped regions. In such an example, the method 1200 is modified such that each strength and fine code that is being exercised ensures that there is no coverage gap in between the strength lines.

In one example, a DCA circuitry (e.g., the DCA circuitry 210) allows for the duty cycle to be updated on-the-fly. For example, the always-on branch 610 of FIG. 6 anchors the rising and falling edges when the strength and/or fine codes are updated on-the-fly. The duty cycle of the corresponding output signal 204 settles after one clock period assuming that the skews between decoder outputs are sufficiently small.

Figure 14:
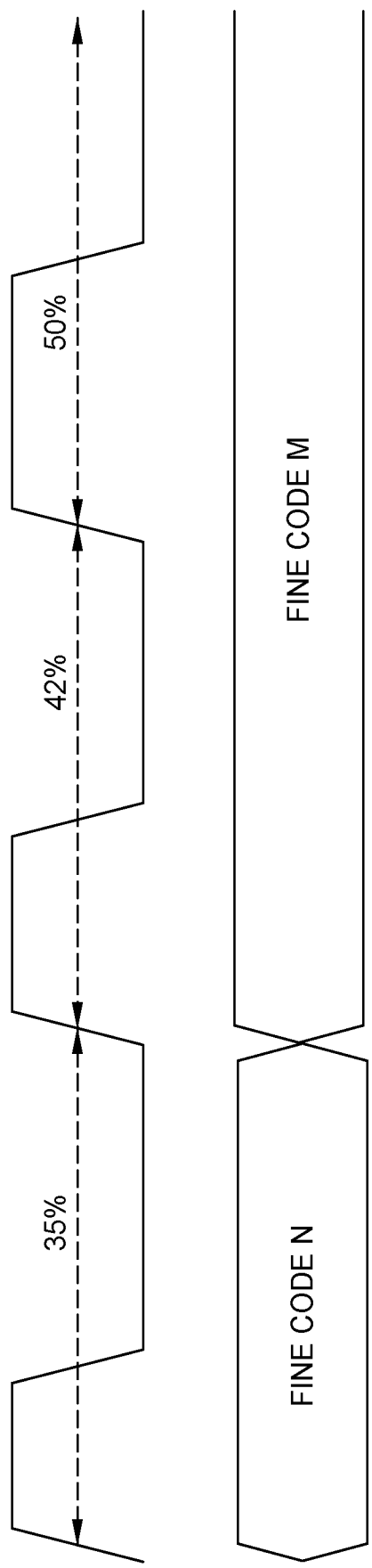
FIG. 14 illustrates an example of code update and clock signal, according to one or more embodiments.

An example of the duty cycle transition is shown in FIG. 14. In the example of FIG. 14, the strength code is assumed to be static and only the fine code is updated. Fine codes N and M correspond to 35 percent and 50 percent duty cycle respectively. When the fine code is updated from N to M (e.g., from 4'h1 to 4'h2 of FIG. 9), the output duty cycle settles to 50 percent after one clock period. The duty cycle of this intermediate clock period is random and bounded between 35 percent and 50 percent. The duty cycle is determined by the skews between fine decoder outputs. Further, both the strength and fine codes can be updated simultaneously while the clock signal is toggling.

In various examples, the above described system and method address the duty cycle distortion presented in data and clock transfer systems. A DCA circuitry (e.g., the DCA circuitry 210) and the method 800 of FIG. 8, and the method 1200 of FIG. 12 balances the timing margin for each phase of the data and clock signals. As is described, the DCA circuitry (e.g., the DCA circuitry 210) includes both strength and fine tuning circuits. The strength tuning circuit adjusts the tuning range while the fine cell adjusts the fine resolution. The DCA circuitry (e.g., the DCA circuitry 210) breaks the tradeoff between tuning range and step size that exists in traditional designs. As will be described in further detail in the following, the methods 800 of FIG. 8 and the method 1200 of FIG. 12 are employed by the DCM circuitry 220 and the duty cycle control circuitry 230 to configure the DCA circuitry 210 to adjust the duty cycle of a signal of the output signal 204 to be at about 50 percent (or a percentage greater than or less 50 percent).

FIG. 15 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1515 (e.g., a speaker), graphics processing unit 1522, video processing unit 1528, and audio processing unit 1532.

The data storage device 1518 may include a machine-readable storage medium 1524 (also known as a non-transitory computer-readable medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A duty cycle adjustment circuitry comprising:
   a first stage including a first strength tuning circuit comprising first inverter branches and a first fine tuning circuit comprising second inverter branches, the first strength tuning circuit and the first fine tuning circuit are coupled in parallel;
   a second stage including a second strength tuning circuit comprising third inverter branches and a second fine tuning circuit comprising fourth inverter branches, the second strength tuning circuit and the second fine tuning circuit are coupled in parallel, wherein the second stage is electrically coupled to the first stage; and
   decoder circuitry electrically coupled to the first stage and the second stage, wherein the decoder circuitry is configured to control the first strength tuning circuit independently from the first fine tuning circuit to adjust a duty cycle of an input signal received by the duty cycle adjustment circuitry.

2. The duty cycle adjustment circuitry of claim 1, wherein the decoder circuitry is configured to:
   determine a first multi-bit control signal based on a first code and a second multi-bit control signal based on a second code; and
   output the first multi-bit control signal to the first strength tuning circuit and the second multi-bit control signal to the first fine tuning circuit.

3. The duty cycle adjustment circuitry of claim 1, wherein controlling the first strength tuning circuit independently from the first fine tuning circuit comprises controlling the first inverter branches independently from the second inverter branches based on different control signals received from the decoder circuitry.

4. The duty cycle adjustment circuitry of claim 3, wherein one or more of the first inverter branches is configured to enabled or disabled based on a first control signal received from the decoder circuitry and one or more of the second inverter branches is configured to enabled or disabled based on a second control signal received from the decoder circuitry.

5. The duty cycle adjustment circuitry of claim 1, wherein the first inverter branches comprise a first branch, a second branch, and a third branch,
wherein each of the first branch, the second branch and the third branch comprises a first transistor and a second transistor coupled to an output node, and
wherein gates of the first transistor and second transistors of each of the first branch, the second branch, and the third branch are coupled to an input node.

6. The duty cycle adjustment circuitry of claim 5,
wherein the first transistor and the second transistor of the first branch of the first strength tuning circuit are directly coupled to a voltage node and a reference voltage node respectively,
wherein the first transistor of each of the second branch and the third branch is coupled to the voltage node via a third transistor, and
wherein the second transistor of each of the second branch and the third branch is coupled to the reference voltage node via a fourth transistor.

7. The duty cycle adjustment circuitry of claim 6, wherein a gate of the third transistor is coupled to a first control node and a gate of the fourth transistor is coupled to a second control node.

8. The duty cycle adjustment circuitry of claim 1, wherein the second inverter branches comprises a first branch, a second branch, and a third branch, each of the first branch, the second branch, and the third branch comprises:
a first transistor and a second transistor coupled to an output node, the first transistor coupled to a voltage node via a third transistor and the second transistor is coupled to a reference voltage node via a fourth transistor, gates of the first transistor and the second transistor of each of the first branch, the second branch, and the third branch coupled to an input node.

9. The duty cycle adjustment circuitry of claim 8, wherein a gate of the third transistor is coupled to a first control node and a gate of the fourth transistor is coupled to a second control node.

10. A duty cycle correction circuitry comprising:
duty cycle adjustment circuitry comprising:
a first stage including a first strength tuning circuit and a first fine tuning circuit;
a second stage including a second strength tuning circuit and a second fine tuning circuit; and
decoder circuitry electrically connected to the first stage and the second stage, wherein the decoder circuitry is configured to control the first strength tuning circuit independently from the first fine tuning circuit; and
duty cycle control circuitry coupled to the duty cycle adjustment circuitry and configured to adjust the first stage and the second stage to adjust a duty cycle of an input signal.

11. The duty cycle correction circuitry of claim 10 further comprising duty cycle measurement circuitry coupled to an output of the duty cycle adjustment circuitry and configured to measure a duty cycle of an output signal of the duty cycle adjustment circuitry.

12. The duty cycle correction circuitry of claim 11, wherein the duty cycle control circuitry is configured to adjust the first stage and the second stage to adjust the duty cycle of the input signal based on the measured duty cycle of the output signal.

13. The duty cycle correction circuitry of claim 10, wherein the second strength tuning circuit and the second fine tuning circuit are configured to be independently controlled.

14. The duty cycle correction circuitry of claim 10, wherein the first strength tuning circuit comprises a first branch, a second branch, and a third branch,
wherein each of the first branch, the second branch and the third branch comprises a first transistor and a second transistor coupled to an output node,
wherein gates of the first transistor and second transistors of each of the first branch, the second branch, and the third branch are coupled to an input node,
wherein the first transistor and second transistor of the first branch of the first strength tuning circuit are directly coupled to a voltage node and a reference voltage node respectively,
wherein the first transistor of each of the second branch and the third branch is coupled to the voltage node via a third transistor, and
wherein the second transistor of each of the second branch and the third branch is coupled to the reference voltage node via a fourth transistor.

15. The duty cycle correction circuitry of claim 10, wherein the first fine tuning circuit comprises a first branch, a second branch, and a third branch, each of the first branch, the second branch, and the third branch comprises:
a first transistor and a second transistor coupled to an output node, the first transistor coupled to a voltage node via a third transistor and the second transistor is coupled to a reference voltage node via a fourth transistor, gates of the first transistor and the second transistor of each of the first branch, the second branch, and the third branch coupled to an input node.

16. A method comprising:
determining an upper fine value and a first strength value of two or more stages of duty cycle adjustment circuitry based on a comparison of a first output signal to a desired duty cycle percentage, wherein the first output signal is generated by the duty cycle adjustment circuitry;
determining a lower fine value of the two or more stages of the duty cycle adjustment circuitry based on a comparison of a second output signal to the desired duty cycle percentage, wherein the second output signal is generated by the duty cycle adjustment circuitry;
determining an average fine value based on the upper fine value and the lower fine value; and
generating, by configuring the two or more stages of the duty cycle adjustment circuitry with the average fine value and the first strength value, a third output signal by the duty cycle adjustment circuitry.

17. The method of claim 16, wherein determining the upper fine value and the first strength value of the two or more stages comprises:
setting the two or more stages to a first fine value and the first strength value to generate the first output signal;
based on a determination that a duty cycle of the first output signal is greater than the desired duty cycle percentage, and based on a determination that the first fine value is not equal to a minimum fine code value, setting the first fine value to the upper fine value; and
based on the determination that the duty cycle of the first output signal is greater than the desired duty cycle percentage, and based on a determination that the first fine value is equal to the minimum fine code value, decreasing the first strength value to a second strength value less than the first strength value.

18. The method of claim 17, wherein determining the upper fine value and the first strength value of the two or more stages of further comprises:

based on a determination that the duty cycle of the first output signal is less than the desired duty cycle percentage, and based on a determination that the first fine value is less than a maximum fine value, increasing the first fine value to a second fine value greater than the first fine value; and based on the determination that the duty cycle of the first output signal is less than the desired duty cycle percentage, and based on a determination that the first fine value is not less than the maximum fine value, increasing the first strength value to a third strength value greater than the first strength value.

19. The method of claim 16, wherein determining the lower fine value of the two or more stages of the duty cycle adjustment circuitry comprises:

setting the two or more stages to a third fine value and the first strength value to generate the second output signal;

based on a determination that a duty cycle of the second output signal is greater than the desired duty cycle percentage, decreasing the third fine value to a fourth fine value less than the third fine value; and based on a determination that the duty cycle of the second output signal is less than the desired duty cycle percentage, storing the third fine value as the lower fine value.

20. The method of claim 16, wherein configuring the two or more stages of the duty cycle adjustment circuitry with the average fine value and the first strength value comprises:

adjusting a first strength cell of a first stage of the two or more stages, a first fine cell of the first stage, a second strength cell of a second stage of the two or more stages, and a second fine cell of the second stage.

* * * * *